(12) United States Patent
Kitano

(10) Patent No.: US 12,256,166 B2
(45) Date of Patent: Mar. 18, 2025

(54) IMAGING APPARATUS AND IMAGING METHOD TO SURPRESSS DARK CURRENT AND IMPROVE QUANTUM EFFICIENCY

(71) Applicant: SONY SEMICONDUCTOR SOLUTIONS CORPORATION, Kanagawa (JP)

(72) Inventor: Shin Kitano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 115 days.

(21) Appl. No.: 18/003,774

(22) PCT Filed: Jun. 3, 2021

(86) PCT No.: PCT/JP2021/021227
§ 371 (c)(1),
(2) Date: Dec. 29, 2022

(87) PCT Pub. No.: WO2022/009573
PCT Pub. Date: Jan. 13, 2022

(65) Prior Publication Data
US 2023/0262362 A1 Aug. 17, 2023

(30) Foreign Application Priority Data
Jul. 9, 2020 (JP) .................................. 2020-118639

(51) Int. Cl.
*H04N 25/78* (2023.01)
*H01L 27/146* (2006.01)
(Continued)

(52) U.S. Cl.
CPC .............. *H04N 25/78* (2023.01); *H04N 25/47* (2023.01); *H04N 25/77* (2023.01); *H04N 25/79* (2023.01); *H01L 27/14634* (2013.01)

(58) Field of Classification Search
CPC ........ H04N 25/78; H04N 25/47; H04N 25/77; H04N 25/79; H01L 27/14634;
(Continued)

(56) References Cited

U.S. PATENT DOCUMENTS 7,586,527 B2 * 9/2009 Noguchi .............. H04N 25/625
348/243
2010/0188540 A1 * 7/2010 Bechtel ................. H04N 25/57
348/E5.091
(Continued)

FOREIGN PATENT DOCUMENTS

| JP | 2012-151771 A | 8/2012 |
| JP | 2018-120981 A | 8/2018 |
| JP | 2020-088676 A | 6/2020 |
| JP | 2020-088724 A | 6/2020 |
| WO | 2017/126232 A1 | 7/2017 |

OTHER PUBLICATIONS

International Search Report and Written Opinion of PCT Application No. PCT/JP2021/021227, issued on Jul. 20, 2021, 09 pages of ISRWO.

*Primary Examiner* — Gevell V Selby
(74) *Attorney, Agent, or Firm* — CHIP LAW GROUP

(57) ABSTRACT

Provided is an imaging apparatus that includes a photoelectric converter that generates a charge according to a received light amount, and a charge transfer region that is disposed at a place inside a substrate not exposed to a substrate surface and in contact with the photoelectric converter, and to which the charge generated by the photoelectric converter is transferred. The imaging apparatus further includes a charge accumulation region that is disposed apart from the charge transfer region in a substrate surface direction and accumulates the charge transferred from the charge transfer region, a transistor that performs control to transfer the charge from the charge transfer region to the charge accumulation region, and a detector that outputs a detection signal indicating whether or not an absolute value of a change amount of an (Continued)

electrical signal according to an amount of the charge transferred by the transistor exceeds a predetermined threshold value.

13 Claims, 24 Drawing Sheets

(51) Int. Cl.
*H04N 25/47* (2023.01)
*H04N 25/77* (2023.01)
*H04N 25/79* (2023.01)

(58) Field of Classification Search
CPC ......... H01L 27/14607; H01L 27/14609; H01L 27/1461; H01L 27/14643; H01L 27/14612; H01L 27/146
See application file for complete search history.

(56) References Cited

U.S. PATENT DOCUMENTS

| | | | |
|---|---|---|---|
| 2011/0122309 A1* | 5/2011 | Sato | G03B 19/12 |
| | | | 348/E5.022 |
| 2019/0206922 A1* | 7/2019 | Kawahito | H01L 31/10 |

* cited by examiner

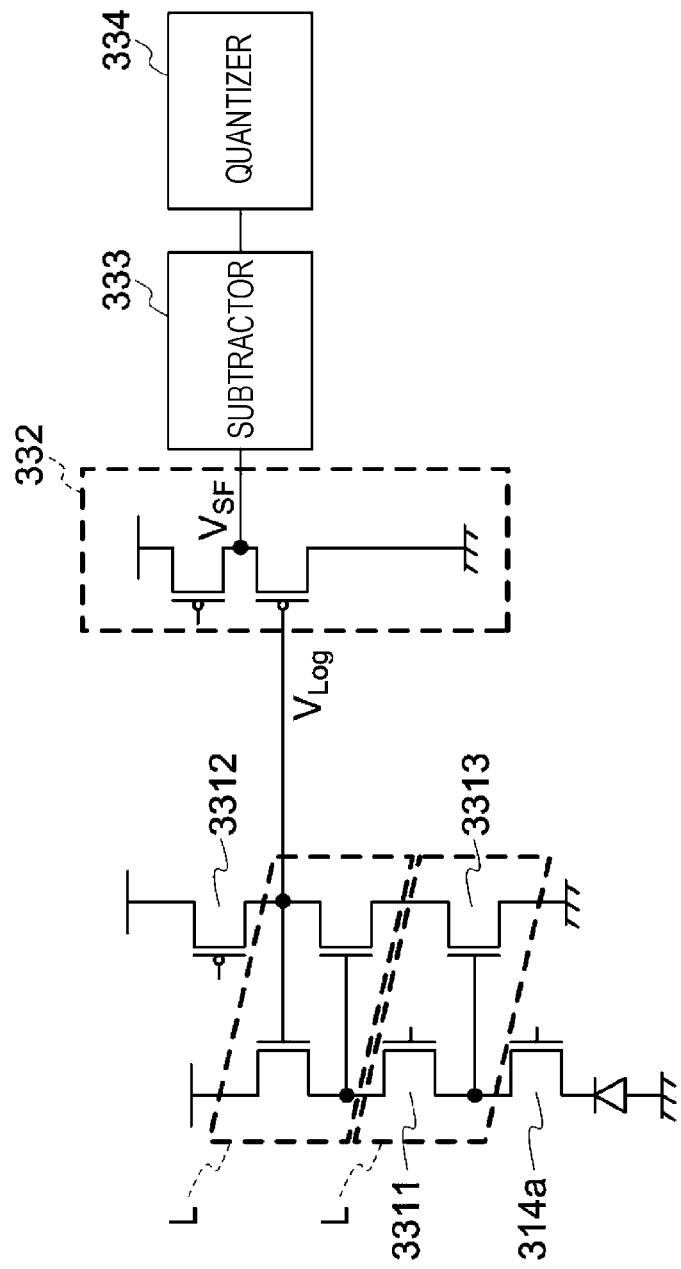

IMAGING APPARATUS AND IMAGING METHOD TO SURPRESSS DARK CURRENT AND IMPROVE QUANTUM EFFICIENCY

CROSS REFERENCE TO RELATED APPLICATIONS

This application is a U.S. National Phase of International Patent Application No. PCT/JP2021/021227 filed on Jun. 3, 2021, which claims priority benefit of Japanese Patent Application No. JP 2020-118639 filed in the Japan Patent Office on Jul. 9, 2020. Each of the above-referenced applications is hereby incorporated herein by reference in its entirety.

TECHNICAL FIELD

Embodiments according to the present disclosure relate to an imaging apparatus and an imaging method.

BACKGROUND ART

There is known an imaging apparatus that acquires data of a portion where a luminance level has changed due to an event only when the event occurs in an imaging scene. This type of imaging apparatus is sometimes referred to as an event base vision sensor (EVS).

CITATION LIST

Patent Document

Patent Document 1: Japanese Patent Application Laid-Open No. 2020-088724

SUMMARY OF THE INVENTION

Problems to be Solved by the Invention

In a conventional EVS, a contact is connected to an N region of a photodiode (hereinafter, referred to as PD) in order to efficiently transfer electrons generated in the PD to a pixel circuit. The contact is connected to the N region of the PD, and then, electrons or holes flow toward the PD via the contact, and it is thus difficult to completely deplete the PD. In addition, it is also necessary to expose the N region to an interface in order to provide the contact, which becomes a generation source of dark current. Furthermore, it is considered that electrons remain in the PD that has not been depleted, and thus quantum effect is reduced. It is therefore difficult to improve EVS characteristics in the dark.

Therefore, the present disclosure provides an imaging apparatus and an imaging method capable of improving characteristics in the dark without making a device structure complicated.

Solutions to Problems

In order to solve the problems described above, the present disclosure provides an imaging apparatus including
a photoelectric converter that generates a charge according to a received light amount,
a charge transfer region that is disposed at a place inside a substrate not exposed to a substrate surface and in contact with the photoelectric converter, and to which the charge generated by the photoelectric converter is transferred,
a charge accumulation region that is disposed apart from the charge transfer region in a substrate surface direction and accumulates the charge transferred from the charge transfer region,
a transistor that performs control to transfer the charge from the charge transfer region to the charge accumulation region, and
a detector that outputs a detection signal indicating whether or not an absolute value of a change amount of an electrical signal according to an amount of the charge transferred by the transistor exceeds a predetermined threshold value.

The charge transfer region may include a floating diffusion region to which no contact is connected.

The transistor may operate in a weak inversion region when transferring the charge from the charge transfer region to the charge accumulation region.

The transistor may include a first transistor and a second transistor disposed between the charge transfer region and the charge accumulation region,
the charge accumulation region may include a first charge accumulation region and a second charge accumulation region,
the first transistor may perform control to transfer the charge from the charge transfer region to the first charge accumulation region, and
the second transistor may perform control to transfer the charge from the first charge accumulation region to the second charge accumulation region.

The first transistor may operate in a weak inversion region when transferring the charge from the charge transfer region to the first charge accumulation region, and
the second transistor may operate in the weak inversion region when transferring the charge from the first charge accumulation region to the second charge accumulation region.

The detector may output the detection signal indicating whether or not the absolute value of the change amount of the electrical signal according to the amount of the charge accumulated in the first charge accumulation region exceeds the threshold value.

The first transistor and the second transistor may generate a potential gradient for transferring the charge from the charge transfer region to the charge accumulation region.

A potential in a channel of the second transistor may be higher than a potential in a channel of the first transistor.

The detector may include
a current-voltage converter that converts a current signal corresponding to the charge accumulated in the first charge accumulation region into a voltage signal,
a subtractor that adjusts a level of the voltage signal,
a quantizer that generates the detection signal by comparing an output signal of the subtractor with a threshold voltage, and
a selector that selects whether or not to supply the voltage signal converted by the current-voltage converter to the subtractor, and
the subtractor and the quantizer may be shared by a plurality of pixels each having the photoelectric converter.

The imaging apparatus may further include
an ADC that is disposed for every one of a plurality of pixels and converts a luminance signal according to the charge generated by the photoelectric converter into a digital signal, and
a selector that selects whether or not to supply the charge accumulated in the first charge accumulation region to the ADC or to supply the charge accumulated in the first charge accumulation region to the detector,
in which the first transistor and the second transistor operate in a saturation region in a case where the selector supplies the charge accumulated in the first charge accumulation region to the ADC, and operate in a weak inversion region in a case where the selector supplies the charge accumulated in the first charge accumulation region to the detector.

The imaging apparatus may further include a first semiconductor chip and a second semiconductor chip that are stacked and transmit and receive signals to and from each other,
in which the first semiconductor chip includes the photoelectric converter for every one of the pixels, and
the second semiconductor chip includes the detector and the ADC for every one of the pixels.

The present disclosure provides an imaging apparatus including
a photoelectric converter that generates a charge according to a received light amount,
a charge transfer region that is disposed at a place inside a substrate not exposed to a substrate surface and in contact with the photoelectric converter, and to which the charge generated by the photoelectric converter is transferred,
a charge accumulation region that is disposed apart from the charge transfer region in a substrate surface direction and accumulates the charge transferred from the charge transfer region,
a potential gradient region in which a potential changes in one direction from the charge transfer region to the charge accumulation region, and
a detector that outputs a detection signal indicating whether or not an absolute value of a change amount of an electrical signal according to an amount of the charge passing through the potential gradient region exceeds a predetermined threshold value.

The potential gradient region may include a region in which a concentration of impurity ions is adjusted.

The present disclosure provides an imaging method including
transferring a charge generated by a photoelectric converter that generates a charge according to a received light amount to a charge transfer region that is disposed at a place inside a substrate not exposed to a substrate surface and in contact with the photoelectric converter,
accumulating the charge transferred from the photoelectric converter to the charge transfer region in a charge accumulation region that is disposed apart from the charge transfer region in a substrate surface direction,
performing control, by a transistor, to transfer the charge from the charge transfer region to the charge accumulation region, and
outputting a detection signal indicating whether or not an absolute value of a change amount of an electrical signal according to an amount of the charge transferred by the transistor exceeds a predetermined threshold value.

BRIEF DESCRIPTION OF DRAWINGS

FIG. 17B is a circuit diagram depicting a second modification of the internal configuration of the light receiver and the address event detector.

MODE FOR CARRYING OUT THE INVENTION

Hereinafter, embodiments of an imaging apparatus and an imaging method will be described with reference to the drawings. Although major configurations of the imaging apparatus will be mainly described below, the imaging apparatus can have configurations and functions that are not illustrated or described. The following description does not exclude configurations and functions that are not illustrated or described.

Figure 1:
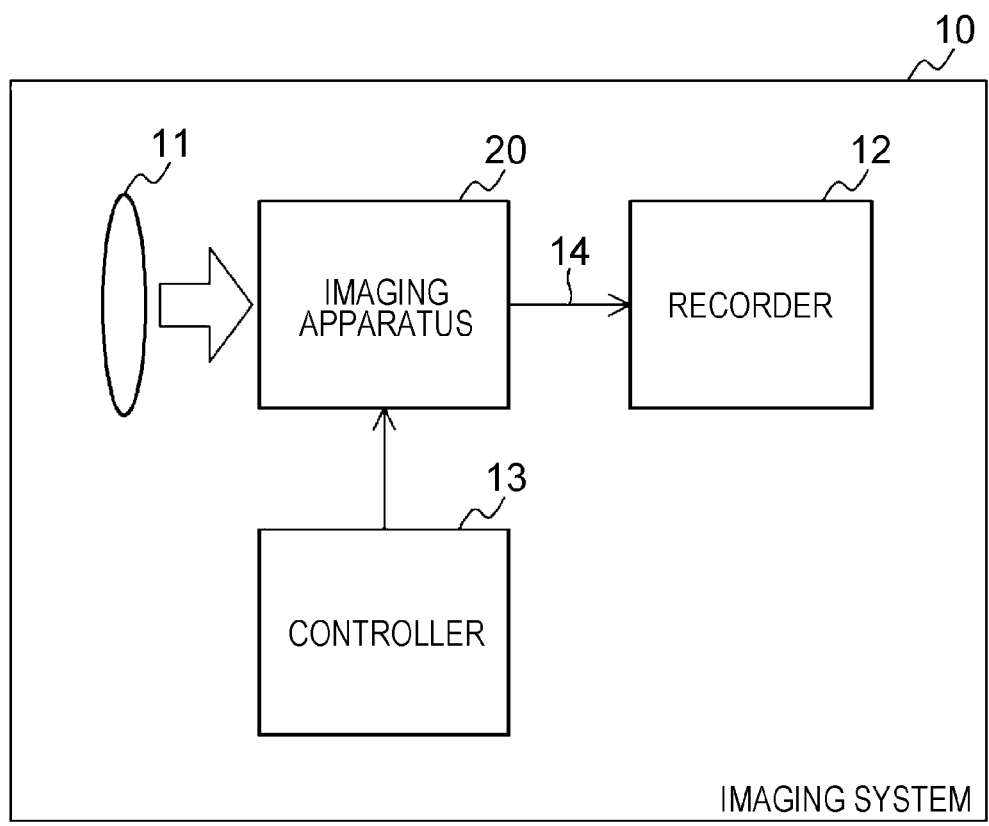
FIG. 1 is a block diagram depicting an example of a system configuration of an imaging system to which a technology of the present disclosure is applied.

FIG. 1 is a block diagram depicting an example of a system configuration of an imaging system to which a technology of the present disclosure is applied.

As illustrated in FIG. 1, an imaging system 10 to which the technology of the present disclosure is applied includes an imaging lens 11, an imaging apparatus 20, a recorder 12, and a controller 13. The imaging system 10 is an example of an electronic device of the present disclosure, and examples of the electronic device include a camera system mounted on an industrial robot, an in-vehicle camera system, and the like.

In the imaging system 10 having the configuration described above, the imaging lens 11 captures incident light from a subject and forms an image on an imaging surface of the imaging apparatus 20. The imaging apparatus 20 photoelectrically converts the incident light captured by the imaging lens 11 in units of pixels to obtain imaging data. As the imaging apparatus 20, an imaging apparatus of the present disclosure described later is used.

The imaging apparatus 20 executes predetermined signal processing such as image recognition processing on the captured image data, and outputs data indicating a processing result and a detection signal (hereinafter, occasionally simply described as a "detection signal") of an address event described later to the recorder 12. A method of generating the detection signal of the address event will be described later. The recorder 12 stores data supplied from the imaging apparatus 20 via a signal line 14. The controller 13 includes, for example, a microcomputer, and controls an imaging operation in the imaging apparatus 20.

[Imaging Apparatus According to First Configuration Example (Arbiter Scheme)]

Figure 2:
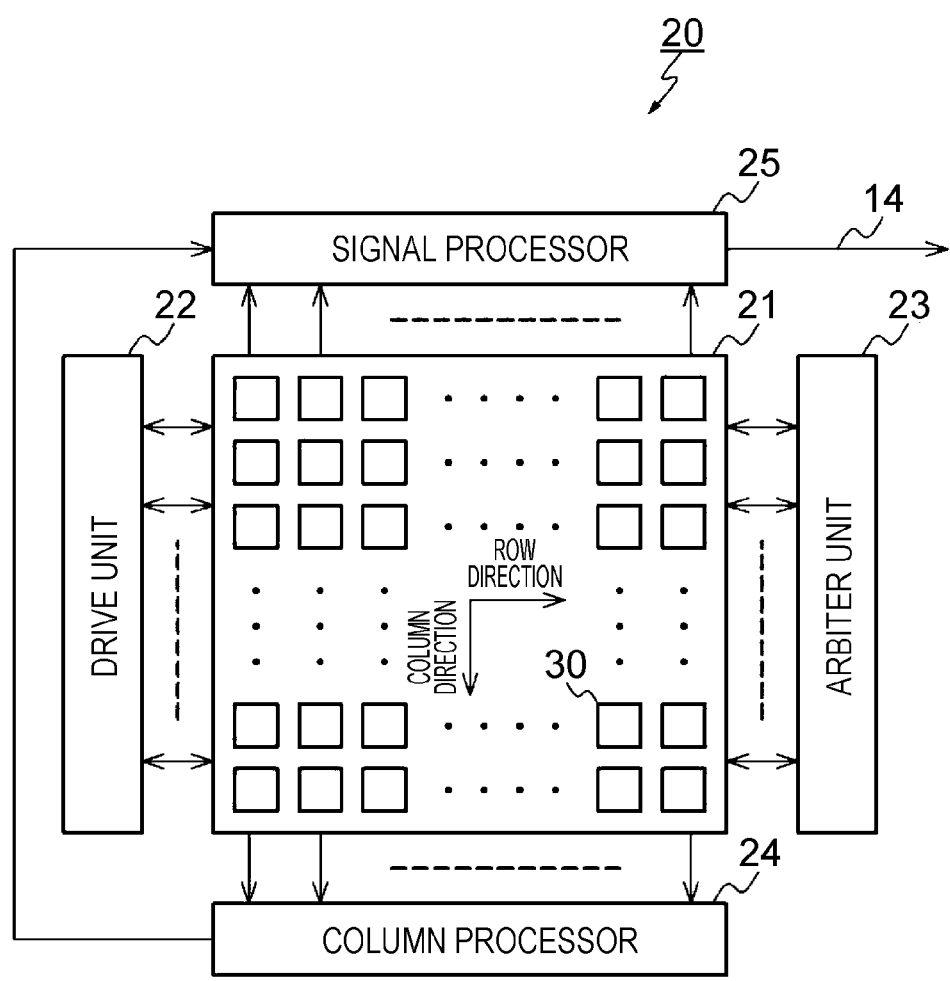
FIG. 2 is a block diagram depicting an example of a configuration of an imaging apparatus according to a first configuration example of the present disclosure.

FIG. 2 is a block diagram depicting an example of a configuration of an imaging apparatus according to a first configuration example used as the imaging apparatus 20 in the imaging system 10 to which the technology of the present disclosure is applied.

As illustrated in FIG. 2, the imaging apparatus 20 according to the first configuration example as the imaging apparatus of the present disclosure is an asynchronous imaging apparatus called DVS, and includes a pixel array unit 21, a drive unit 22, an arbiter unit (arbitration unit) 23, a column processor 24, and a signal processor 25.

In the imaging apparatus 20 having the configuration described above, a plurality of pixels 30 is two-dimensionally arranged in a matrix (array) in the pixel array unit 21. A vertical signal line VSL described later is wired for each pixel column with respect to this pixel array in matrix.

Each of the plurality of pixels 30 generates an analog signal of a voltage corresponding to a photocurrent as a pixel signal. Furthermore, each of the plurality of pixels 30 detects presence or absence of an address event on the basis of whether or not a change amount of the photocurrent exceeds a predetermined threshold value. Then, when an address event occurs, each of the pixels 30 outputs a request to the arbiter unit 23.

The drive unit 22 drives each of the plurality of pixels 30 to output the pixel signal generated in each pixel 30 to the column processor 24.

The arbiter unit 23 arbitrates the request from each of the plurality of pixels 30 and transmits a response based on the arbitration result to the pixel 30. The pixel 30 that has received the response from the arbiter unit 23 supplies a detection signal (detection signal of the address event) indicating a detection result to the drive unit 22 and the signal processor 25. Reading of the detection signal from the pixel 30 can be performed by reading a plurality of rows.

The column processor 24 includes, for example, an analog-to-digital converter, and performs processing of converting an analog pixel signal output from the pixel 30 of the column into a digital signal for each pixel column of the pixel array unit 21. Then, the column processor 24 supplies the analog-digital converted digital signal to the signal processor 25.

The signal processor 25 performs predetermined signal processing such as correlated double sampling (CDS) processing or image recognition processing on the digital signal supplied from the column processor 24. Then, the signal processor 25 supplies data indicating processing result and the detection signal supplied from the arbiter unit 23 to the recorder 12 (see FIG. 1) via the signal line 14.

[Configuration Example of Pixel Array Unit]

Figure 3:
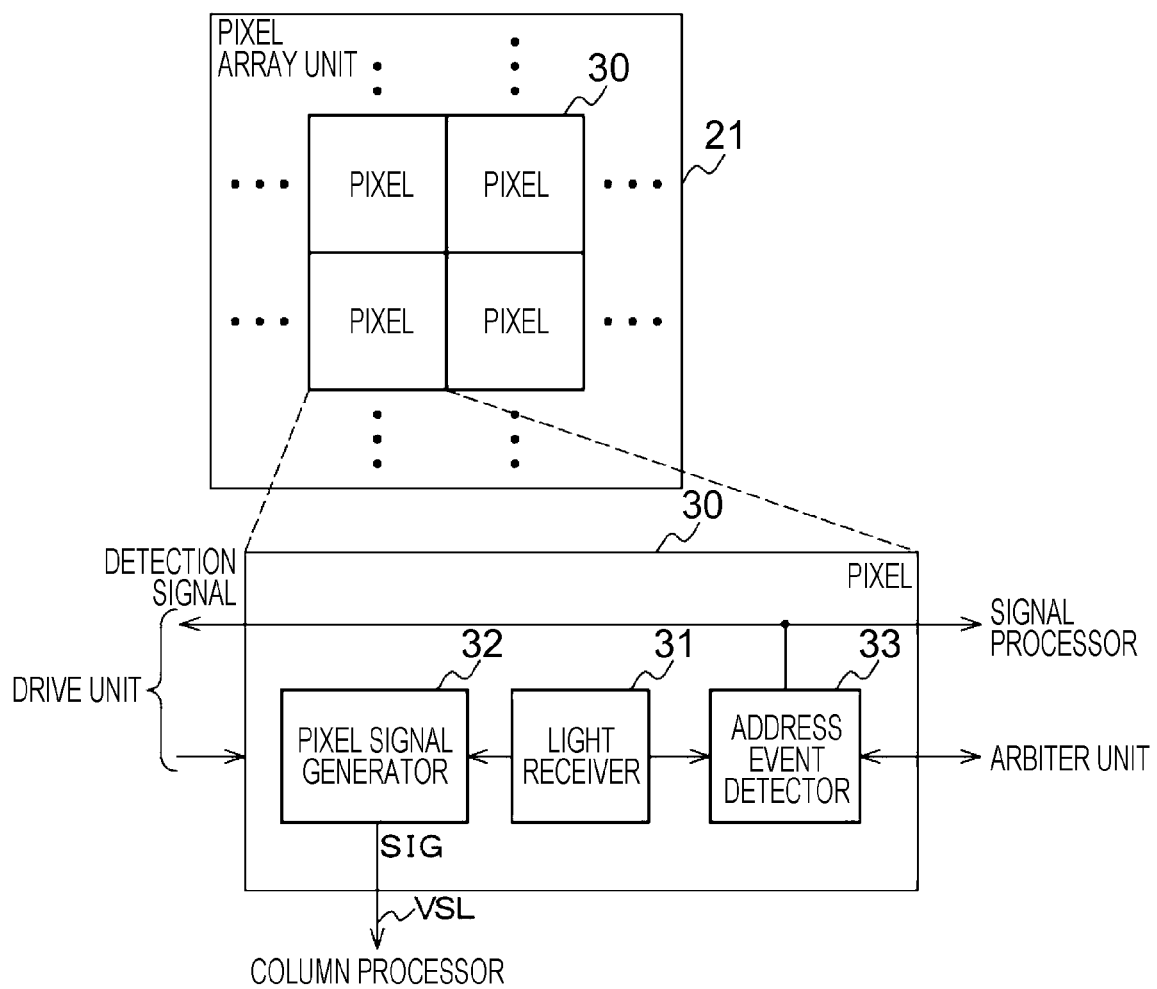
FIG. 3 is a block diagram depicting an example of a configuration of a pixel array unit.

FIG. 3 is a block diagram depicting an example of a configuration of the pixel array unit 21.

In the pixel array unit 21 in which the plurality of pixels 30 is two-dimensionally arranged in a matrix, each of the plurality of pixels 30 includes a light receiver 31, a pixel signal generator 32, and an address event detector 33.

In the pixel 30 having the configuration described above, the light receiver 31 photoelectrically converts incident light to generate a photocurrent. Then, the light receiver 31 supplies the photocurrent generated by photoelectric conversion to either the pixel signal generator 32 or the address event detector 33 under the control of the drive unit 22 (see FIG. 2).

The pixel signal generator 32 generates a signal of a voltage corresponding to the photocurrent supplied from the light receiver 31 as a pixel signal SIG, and supplies the generated pixel signal SIG to the column processor 24 (see FIG. 2) via the vertical signal line VSL.

The address event detector 33 detects presence or absence of an address event on the basis of whether or not a change amount of the photocurrent from each light receiver 31 exceeds a predetermined threshold value. The address event includes, for example, an on-event indicating that the change amount of the photocurrent exceeds an upper limit threshold value and an off-event indicating that the change amount falls below a lower limit threshold value. In addition, the detection signal of the address event includes, for example, one bit indicating a detection result of the on-event and one bit indicating a detection result of the off-event. Note that the address event detector 33 can be configured to detect only an on-event.

When an address event occurs, the address event detector 33 supplies a request for transmitting the detection signal of the address event to the arbiter unit 23 (see FIG. 2). Then, when receiving a response to the request from the arbiter unit 23, the address event detector 33 supplies the detection signal of the address event to the drive unit 22 and the signal processor 25.

[Example of Circuit Configuration of Pixel]

Figure 4:
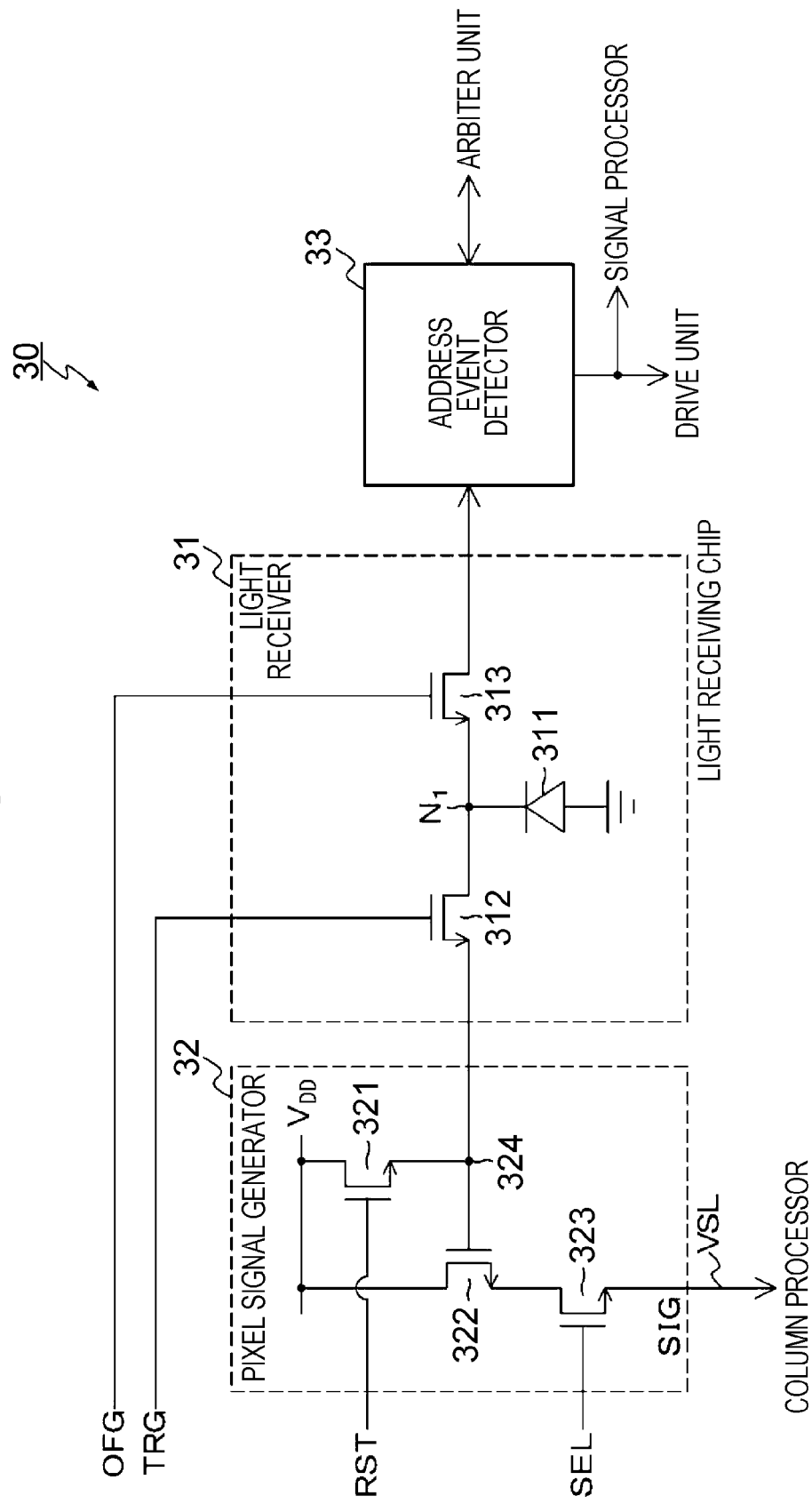
FIG. 4 is a circuit diagram depicting an example of a circuit configuration of a pixel.

FIG. 4 is a circuit diagram depicting an example of a circuit configuration of the pixel 30. As described above, each of the plurality of pixels 30 includes the light receiver 31, the pixel signal generator 32, and the address event detector 33.

In the pixel 30 having the configuration described above, the light receiver 31 includes a light receiving element (photoelectric conversion element) 311, a transfer transistor 312, and an OFG (over flow gate) transistor 313. As the transfer transistor 312 and the OFG transistor 313, for example, an N-type metal oxide semiconductor (MOS) transistor is used. The transfer transistor 312 and the OFG transistor 313 are connected in series to each other.

The light receiving element 311 is connected between a common connection node N1 of the transfer transistor 312 and the OFG transistor 313 and a ground, and photoelectrically converts the incident light to generate a charge having a charge amount corresponding to an amount of the incident light.

A transfer signal TRG is supplied from the drive unit 22 illustrated in FIG. 2 to a gate electrode of the transfer transistor 312. In response to the transfer signal TRG, the transfer transistor 312 supplies the charge photoelectrically converted by the light receiving element 311 to the pixel signal generator 32.

A control signal OFG is supplied from the drive unit 22 to a gate electrode of the OFG transistor 313. In response to the control signal OFG, the OFG transistor 313 supplies an electrical signal generated by the light receiving element 311 to the address event detector 33. The electrical signal supplied to the address event detector 33 is a photocurrent including charges.

The pixel signal generator 32 includes a reset transistor 321, an amplification transistor 322, a selection transistor 323, and a floating diffusion layer 324. As the reset transistor 321, the amplification transistor 322, and the selection transistor 323, for example, N-type MOS transistors are used.

The charge photoelectrically converted by the light receiving element 311 is supplied from the light receiver 31 to the pixel signal generator 32 by the transfer transistor 312. The charge supplied from the light receiver 31 is accumulated in the floating diffusion layer 324. The floating diffusion layer 324 generates a voltage signal having a voltage value corresponding to an amount of accumulated charge. That is, the floating diffusion layer 324 converts electric charge into voltage.

The reset transistor 321 is connected between a power line of a power supply voltage VDD and the floating diffusion layer 324. A reset signal RST is supplied from the drive unit 22 to a gate electrode of the reset transistor 321. The reset transistor 321 initializes (resets) the charge amount of the floating diffusion layer 324 in response to the reset signal RST.

The amplification transistor 322 is connected in series with the selection transistor 323 between the power line of the power supply voltage VDD and the vertical signal line VSL. The amplification transistor 322 amplifies the voltage signal subjected to charge-voltage conversion by the floating diffusion layer 324.

A selection signal SEL is supplied from the drive unit 22 to a gate electrode of the selection transistor 323. In response to the selection signal SEL, the selection transistor 323 outputs the voltage signal amplified by the amplification transistor 322 to the column processor 24 (see FIG. 2) via the vertical signal line VSL as the pixel signal SIG.

In the imaging apparatus 20 including the pixel array unit 21 in which the pixels 30 having the configuration described above are two-dimensionally arranged, when the controller 13 illustrated in FIG. 1 instructs to start detection of an address event, the drive unit 22 supplies the control signal OFG to the OFG transistor 313 of the light receiver 31, and drives the OFG transistor 313 to supply photocurrent to the address event detector 33.

Then, when an address event is detected in a certain pixel 30, the drive unit 22 turns off the OFG transistor 313 of the pixel 30 and stops the supply of photocurrent to the address event detector 33. Next, the drive unit 22 drives the transfer transistor 312 by supplying the transfer signal TRG to the transfer transistor 312, and transfers the charge photoelectrically converted by the light receiving element 311 to the floating diffusion layer 324.

In this manner, the imaging apparatus 20 including the pixel array unit 21 in which the pixels 30 having the configuration described above are two-dimensionally arranged outputs only the pixel signal of the pixel 30 in which the address event is detected to the column processor 24. As a result, regardless of the presence or absence of an address event, power consumption of the imaging apparatus 20 and a processing amount of image processing can be reduced as compared with a case where the pixel signals of all the pixels are output.

Note that the configuration of the pixel 30 exemplified here is an example, and is not limited to this configuration example. For example, the pixels can have a configuration not including the pixel signal generator 32. In such a configuration of pixels, the OFG transistor 313 may be omitted in the light receiver 31, and the transfer transistor 312 is only required to have a function of the OFG transistor 313.

[First Configuration Example of Address Event Detector]

Figure 5:
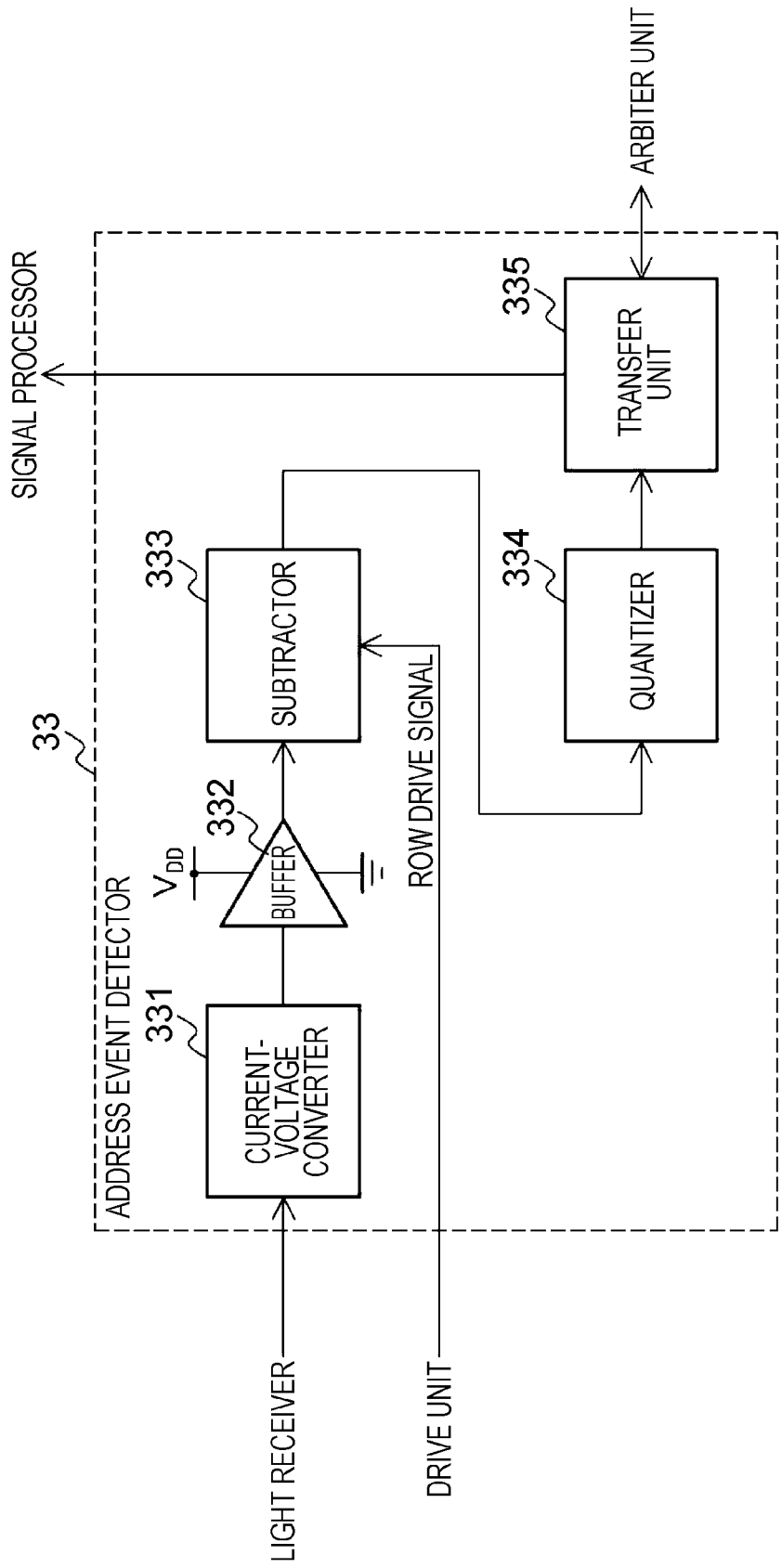
FIG. 5 is a block diagram depicting a first configuration example of an address event detector.

FIG. 5 is a block diagram depicting a first configuration example of the address event detector 33. As illustrated in FIG. 5, the address event detector 33 according to the present configuration example includes a current-voltage converter 331, a buffer 332, a subtractor 333, a quantizer 334, and a transfer unit 335.

The current-voltage converter 331 converts the photocurrent from the light receiver 31 of the pixel 30 into a logarithmic voltage signal. The current-voltage converter 331 supplies the converted voltage signal to the buffer 332. The buffer 332 buffers the voltage signal supplied from the current-voltage converter 331 and supplies the voltage signal to the subtractor 333.

A row drive signal is supplied from the drive unit 22 to the subtractor 333. The subtractor 333 reduces a level of the voltage signal supplied from the buffer 332 in accordance with the row drive signal. Then, the subtractor 333 supplies the voltage signal after the level reduction to the quantizer 334. The quantizer 334 quantizes the voltage signal supplied from the subtractor 333 into a digital signal and outputs the digital signal to the transfer unit 335 as a detection signal of an address event.

The transfer unit 335 transfers the detection signal of the address event supplied from the quantizer 334 to the arbiter unit 23 and the like. When an address event is detected, the transfer unit 335 supplies a request for transmitting the detection signal of the address event to the arbiter unit 23. Then, when receiving a response to the request from the arbiter unit 23, the transfer unit 335 supplies the detection signal of the address event to the drive unit 22 and the signal processor 25.

Next, configuration examples of the current-voltage converter 331, the subtractor 333, and the quantizer 334 in the address event detector 33 will be described.

[Configuration Example of Current-Voltage Converter]

Figure 6:
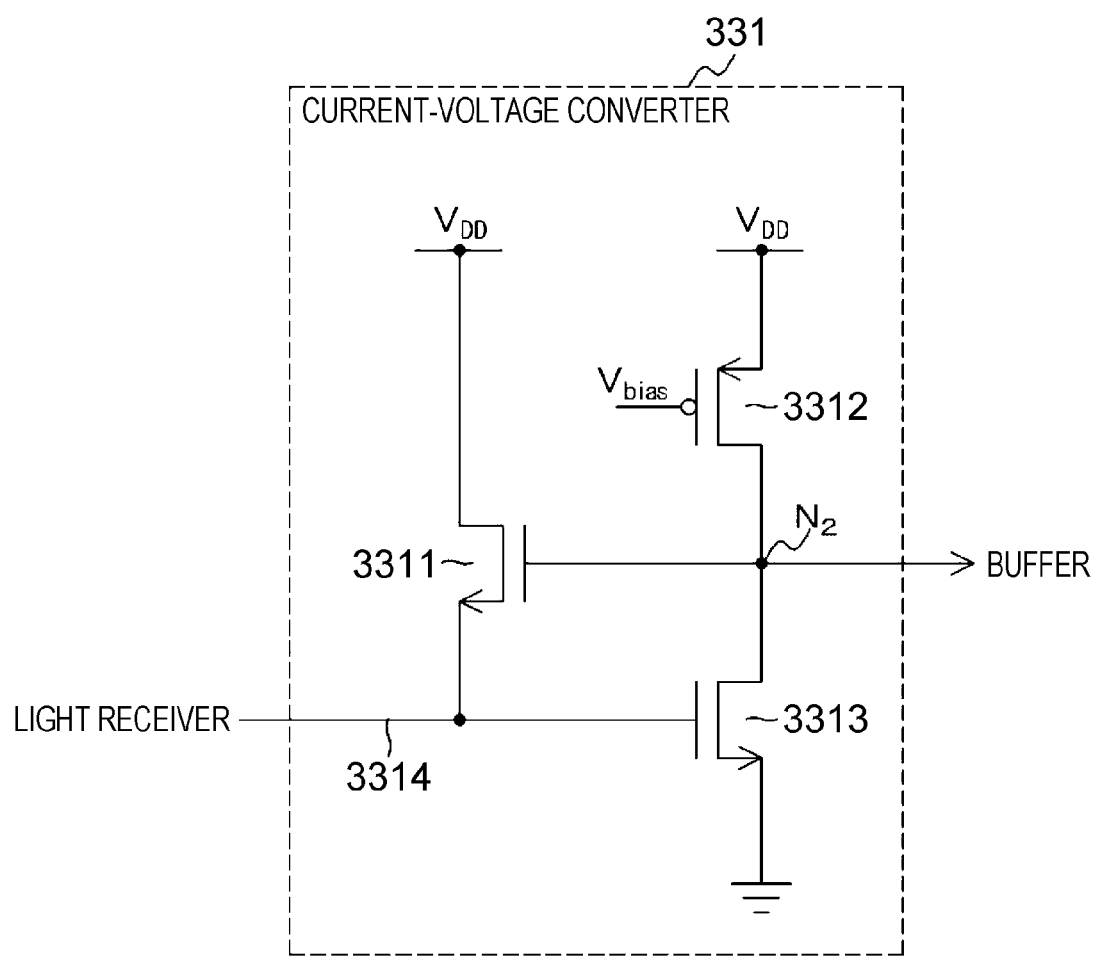
FIG. 6 is a circuit diagram depicting an example of a configuration of a current-voltage converter in the address event detector.

FIG. 6 is a circuit diagram depicting an example of a configuration of the current-voltage converter 331 in the address event detector 33. As illustrated in FIG. 6, the current-voltage converter 331 of the present example has a circuit configuration including an N-type transistor 3311, a P-type transistor 3312, and an N-type transistor 3313. As these transistors 3311 to 3313, for example, MOS transistors are used.

The N-type transistor 3311 is connected between the power line of the power supply voltage VDD and a signal input line 3314. The P-type transistor 3312 and the N-type transistor 3313 are connected in series between the power line of the power supply voltage VDD and the ground. Then, a common connection node N2 of the P-type transistor 3312 and the N-type transistor 3313 is connected to a gate electrode of the N-type transistor 3311 and an input terminal of the buffer 332 illustrated in FIG. 5.

A predetermined bias voltage Vbias is applied to a gate electrode of the P-type transistor 3312. As a result, the P-type transistor 3312 supplies a constant current to the N-type transistor 3313. A photocurrent is input from the light receiver 31 to a gate electrode of the N-type transistor 3313 through the signal input line 3314.

Drain electrodes of the N-type transistor 3311 and the N-type transistor 3313 are connected to a side of a power supply, and such a circuit is called a source follower. The photocurrent from the light receiver 31 is converted into a logarithmic voltage signal by two source followers connected in a loop.

[Configuration Examples of Subtractor and Quantizer]

Figure 7:
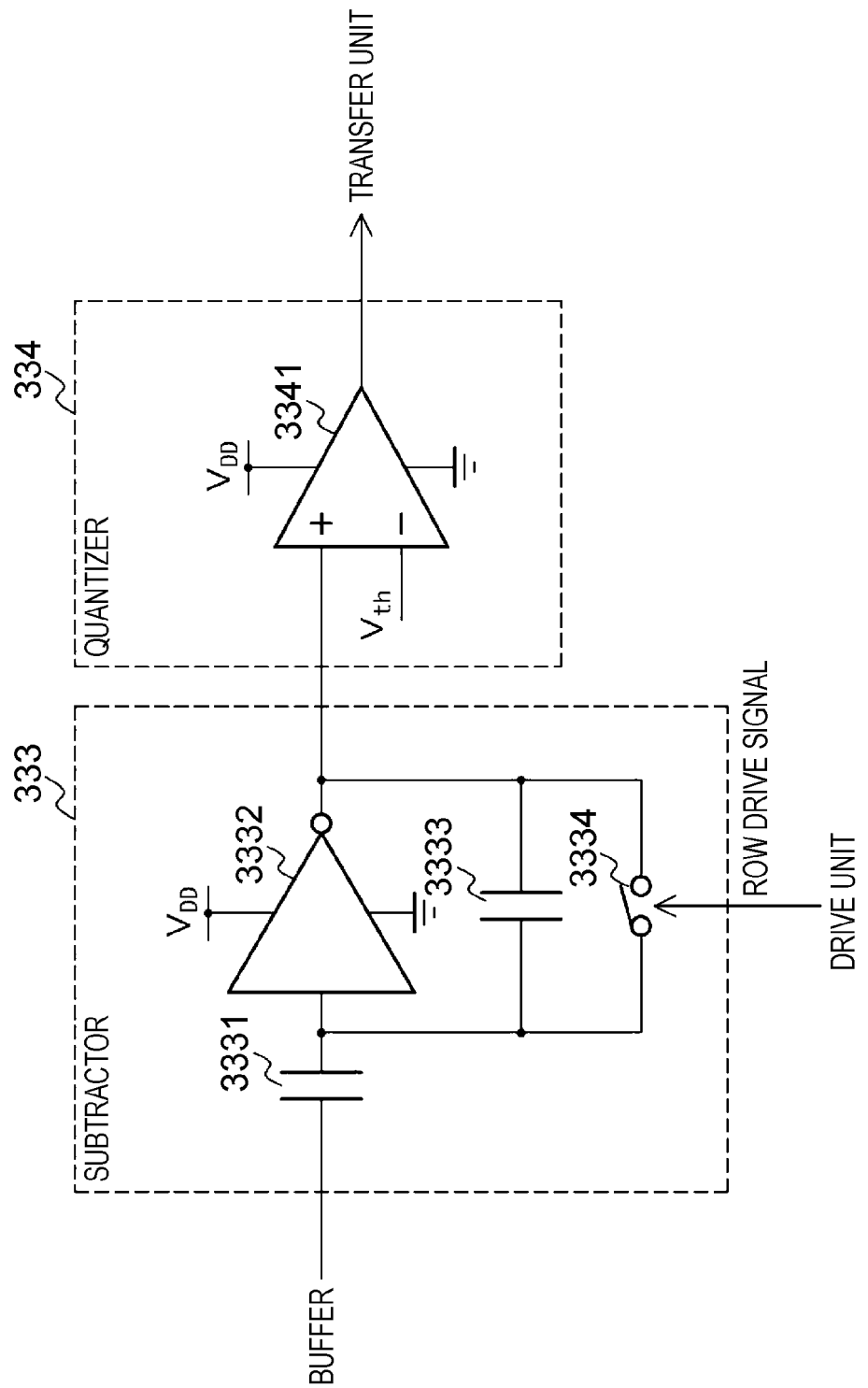
FIG. 7 is a circuit diagram depicting an example of configurations of a subtractor and a quantizer in the address event detector.

FIG. 7 is a circuit diagram depicting an example of configurations of the subtractor 333 and the quantizer 334 in the address event detector 33.

The subtractor 333 of the present example includes a capacitive element 3331, an inverter circuit 3332, a capacitive element 3333, and a switch element 3334.

One end of the capacitive element 3331 is connected to an output terminal of the buffer 332 illustrated in FIG. 5, and the other end of the capacitive element 3331 is connected to an input terminal of the inverter circuit 3332. The capacitive element 3333 is connected in parallel to the inverter circuit 3332. The switch element 3334 is connected between both ends of the capacitive element 3333. A row drive signal is supplied from the drive unit 22 to the switch element 3334 as an on-off control signal. The switch element 3334 opens and closes a path connecting both ends of the capacitive element 3333 in response to the row drive signal. The inverter circuit 3332 inverts a polarity of a voltage signal input via the capacitive element 3331.

In the subtractor 333 having the configuration described above, when the switch element 3334 is turned on (closed), a voltage signal Vinit is input to a terminal of the capacitive element 3331 on a side of the buffer 332 and a terminal on the opposite side becomes a virtual ground terminal. A potential of the virtual ground terminal is set to zero for convenience. At this time, a capacitance value of the capacitive element 3331 is C1, and then, a charge Qinit accumulated in the capacitive element 3331 is expressed by Equation (1) below. On the other hand, since both ends of the capacitive element 3333 are short-circuited, the accumulated charge becomes zero.

$$Q\text{init}=C1 \times V\text{init} \tag{1}$$

Next, considering a case where the switch element 3334 is turned off (open) and the voltage of the terminal of the capacitive element 3331 on the side of the buffer 332 changes to Vafter, a charge Qafter accumulated in the capacitive element 3331 is expressed by Equation (2) below.

$$Q\text{after}=C1 \times V\text{after} \tag{2}$$

On the other hand, a capacitance value of the capacitive element 3333 is C2 and an output voltage is Vout, and then, a charge Q2 accumulated in the capacitive element 3333 is expressed by Equation (3) below.

$$Q2=-C2 \times V\text{out} \tag{3}$$

At this time, since a total charge amount of the capacitive element 3331 and the capacitive element 3333 does not change, Equation (4) below is established.

$$Q\text{init}=Q\text{after}+Q2 \tag{4}$$

Equations (1) to (3) are substituted into Equation (4) and deformed, and then, Equation (5) below is obtained.

$$V\text{out}=-(C1/C2) \times (V\text{after}-V\text{init}) \tag{5}$$

Equation (5) represents a subtraction operation of the voltage signal, and a gain of a subtraction result is C1/C2. Since it is usually desired to maximize the gain, it is preferable to design C1 to be large and C2 to be small. On the other hand, when C2 is excessively small, kTC noise increases, and noise characteristics may deteriorate. Therefore, capacity reduction of C2 is limited to such a range as to tolerate noise. Furthermore, since the address event detector 33 including the subtractor 333 is mounted for each pixel 30, the capacitive element 3331 and the capacitive element 3333 have area restrictions. The capacitance values C1 and C2 of the capacitive elements 3331 and 3333 are determined in consideration of the above.

In FIG. 7, the quantizer 334 includes a comparator 3341. The comparator 3341 takes an output signal of the inverter circuit 3332, that is, a voltage signal from the subtractor 430 as a non-inverting (+) input, and takes a predetermined threshold voltage Vth as an inverting (−) input. Then, the comparator 3341 compares the voltage signal from the subtractor 430 with the predetermined threshold voltage Vth, and outputs a signal indicating a comparison result to the transfer unit 335 as a detection signal of an address event.

[Second Configuration Example of Address Event Detector]

Figure 8:
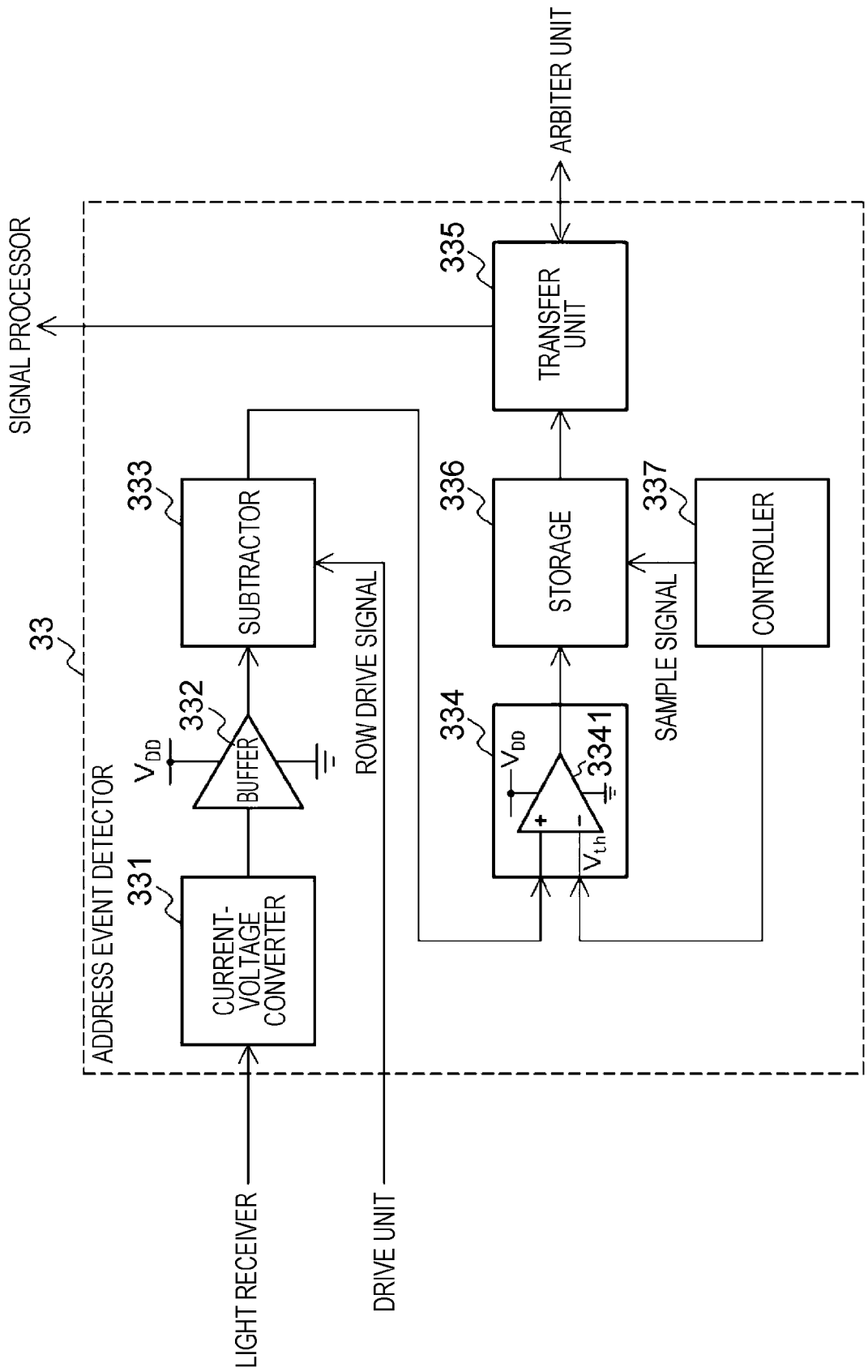
FIG. 8 is a block diagram depicting a second configuration example of the address event detector.

FIG. 8 is a block diagram depicting a second configuration example of the address event detector 33. As illustrated in FIG. 8, the address event detector 33 according to the present configuration example includes a storage 336 and a controller 337 in addition to the current-voltage converter 331, the buffer 332, the subtractor 333, the quantizer 334, and the transfer unit 335.

The storage 336 is provided between the quantizer 334 and the transfer unit 335, and accumulates the output of the quantizer 334, that is, the comparison result of the comparator 3341 on the basis of a sample signal supplied from the controller 337. The storage 336 may be a sampling circuit such as a switch, plastic, or a capacitor, or may be a digital memory circuit such as a latch or a flip-flop.

The controller 337 supplies the predetermined threshold voltage Vth to an inverting (−) input terminal of the comparator 3341. The threshold voltage Vth supplied from the controller 337 to the comparator 3341 may have different voltage values in a time division manner. For example, the controller 337 supplies a threshold voltage Vth1 corresponding to the on-event indicating that the change amount of the photocurrent exceeds the upper limit threshold value and a threshold voltage Vth2 corresponding to the off-event indicating that the change amount falls below the lower limit threshold value at different timings, and thus one comparator 3341 can detect a plurality of types of address events.

For example, the storage 336 may accumulate the comparison result of the comparator 3341 using the threshold voltage Vth1 corresponding to the on-event in a period in which the threshold voltage Vth2 corresponding to the off-event is supplied from the controller 337 to the inverting (−) input terminal of the comparator 3341. Note that the storage 336 may be inside the pixel 30 or may be outside the pixel 30. In addition, the storage 336 is not an essential component of the address event detector 33. That is, the storage 336 may be omitted.

[Imaging Apparatus (Scanning Scheme) According to Second Configuration Example]

The imaging apparatus 20 according to the first configuration example described above is an asynchronous imaging apparatus that reads an event by an asynchronous reading scheme. However, the event reading scheme is not limited to the asynchronous reading scheme, and may be a synchronous reading scheme. The imaging apparatus to which the synchronous reading scheme is applied is an imaging apparatus of a scanning scheme, which is the same as a normal imaging apparatus that performs imaging at a predetermined frame rate.

Figure 9:
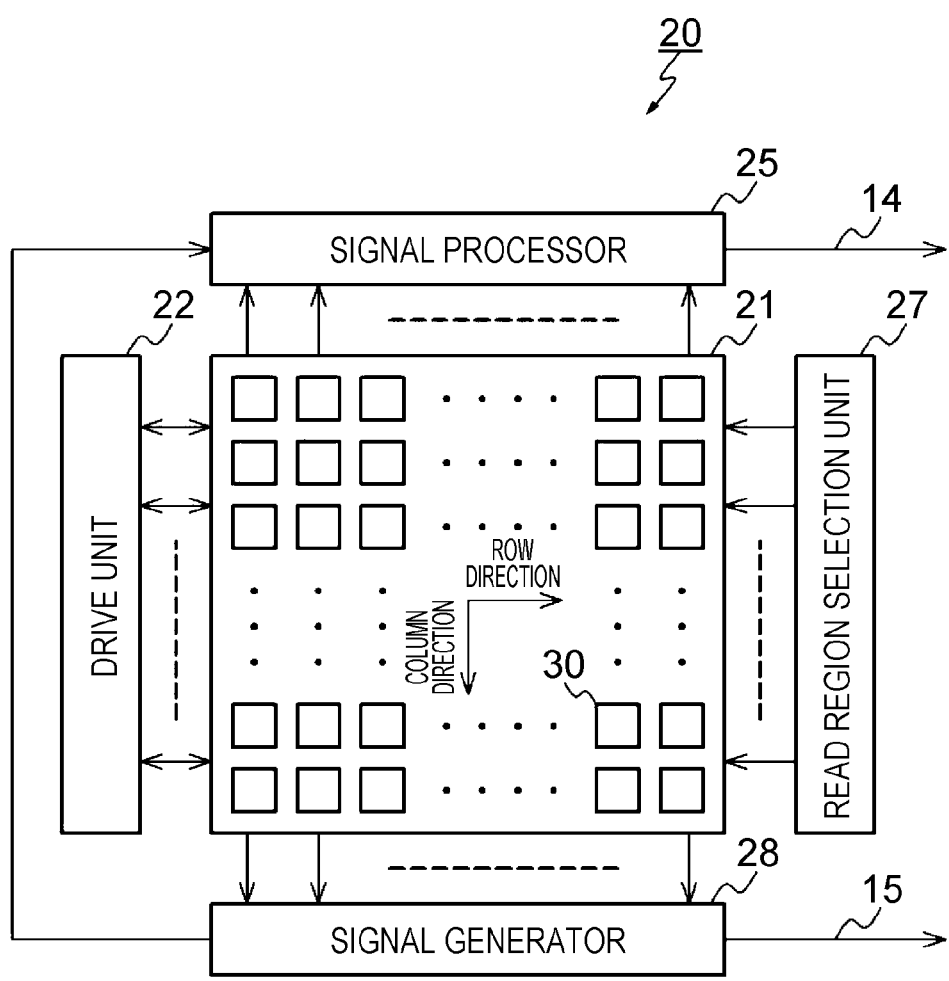
FIG. 9 is a block diagram depicting an example of a configuration of an imaging apparatus according to the second configuration example of the present disclosure.

FIG. 9 is a block diagram depicting an example of a configuration of an imaging apparatus according to a second configuration example used as the imaging apparatus 20 in the imaging system 10 to which the technology of the present disclosure is applied, that is an imaging apparatus of the scanning scheme.

As illustrated in FIG. 9, the imaging apparatus 20 according to the second configuration example as the imaging apparatus of the present disclosure includes the pixel array unit 21, the drive unit 22, the signal processor 25, a read region selection unit 27, and a signal generator 28.

The pixel array unit 21 includes the plurality of pixels 30. The plurality of pixels 30 outputs an output signal in response to a selection signal of the read region selection unit 27. Each of the plurality of pixels 30 can have a quantizer in the pixel as illustrated in FIG. 7, for example. The plurality of pixels 30 outputs an output signal corresponding to a change amount of an intensity of light. The plurality of pixels 30 may be two-dimensionally arranged in a matrix as illustrated in FIG. 9.

The drive unit 22 drives each of the plurality of pixels 30 to output the pixel signal generated in each pixel 30 to the signal processor 25. Note that the drive unit 22 and the signal processor 25 are circuit units for obtaining gradation information. Therefore, in a case where only event information is to be obtained, the drive unit 22 and the signal processor 25 may be omitted.

The read region selection unit 27 selects some of the plurality of pixels 30 included in the pixel array unit 21. For example, the read region selection unit 27 selects any one or a plurality of rows among the rows included in the structure of the two-dimensional matrix corresponding to the pixel array unit 21. The read region selection unit 27 sequentially selects one or a plurality of rows in accordance with a preset cycle. Furthermore, the read region selection unit 27 may determine a selected region in response to a request from each pixel 30 of the pixel array unit 21.

On the basis of the output signal of the pixel selected by the read region selection unit 27, the signal generator 28 generates an event signal corresponding to an active pixel in which an event has been detected among the selected pixels. The event is an event in which the intensity of light changes. The active pixel is a pixel in which the change amount of the intensity of light corresponding to the output signal exceeds or falls below a preset threshold value. For example, the signal generator 28 compares the output signal of the pixel with a reference signal, detects an active pixel that outputs the output signal in a case where the output signal is larger or smaller than the reference signal, and generates an event signal corresponding to the active pixel.

The signal generator 28 can include, for example, a column selection circuit that arbitrates a signal entering the signal generator 28. Furthermore, the signal generator 28 can be configured to output not only information of the active pixel in which an event has been detected but also information of an inactive pixel in which an event has not been detected.

Address information and time stamp information (for example, (X, Y, T)) of the active pixel in which the event has been detected are output from the signal generator 28 through an output line 15. However, data output from the signal generator 28 may be not only the address information and the time stamp information but also information in a frame format (for example, (0, 0, 1, 0, . . . )).

[Configuration Example of Chip Structure]

Figure 10:
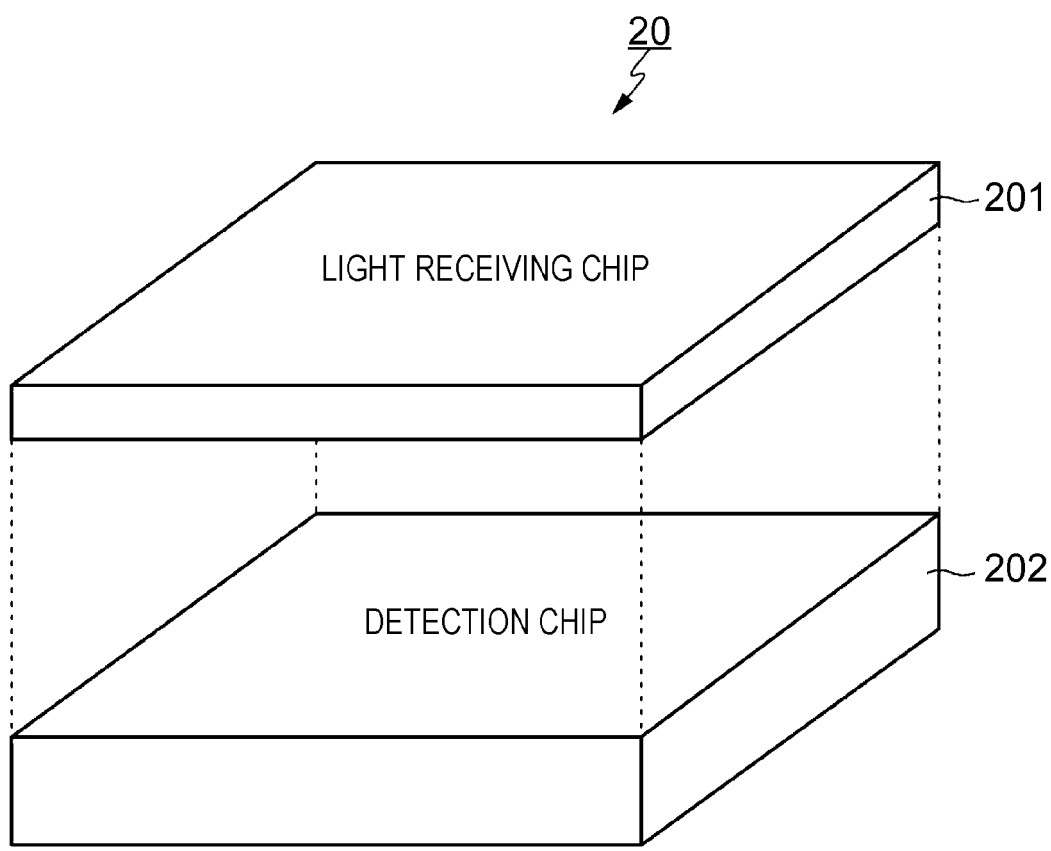
FIG. 10 is an exploded perspective view schematically depicting a stacked chip structure of the imaging apparatus.

As a chip (semiconductor integrated circuit) structure of the imaging apparatus 20 according to the first configuration example or the second configuration example described above, for example, a stacked chip structure can be adopted. FIG. 10 is an exploded perspective view schematically depicting a stacked chip structure of the imaging apparatus 20.

As illustrated in FIG. 10, the stacked chip structure, that is, a stacked structure has a structure in which at least two chips of a light receiver chip 201 as a first chip and a detection chip 202 as a second chip are stacked. Then, in the circuit configuration of the pixel 30 illustrated in FIG. 4, each of the light receiving elements 311 is disposed on the light receiving chip 201, and all elements other than the light receiving element 311, elements of other circuit parts of the pixel 30, and the like are disposed on the detection chip 202. The light receiving chip 201 and the detection chip 202 are electrically connected via a connection portion such as a via, Cu—Cu bonding, or a bump.

Note that, a configuration example has been herein exemplified in which the light receiving element 311 is disposed on the light receiving chip 201, and elements other than the light receiving element 311, elements of other circuit portions of the pixel 30, and the like are disposed on the detection chip 202, but the present invention is not limited to this configuration example.

For example, in the circuit configuration of the pixel 30 illustrated in FIG. 4, each element of the light receiver 31 can be disposed on the light receiving chip 201, and elements other than the light receiver 31, elements of other circuit portions of the pixel 30, and the like can be disposed on the detection chip 202. In addition, each element of the light receiver 31, and the reset transistor 321 and the floating diffusion layer 324 of the pixel signal generator 32 can be disposed on the light receiving chip 201, and the other elements can be disposed on the detection chip 202. Furthermore, some of the elements constituting the address event detector 33 can be disposed on the light receiving chip 201 together with each element of the light receiver 31 and the like.

[Configuration Example of Column Processor]

Figure 11:
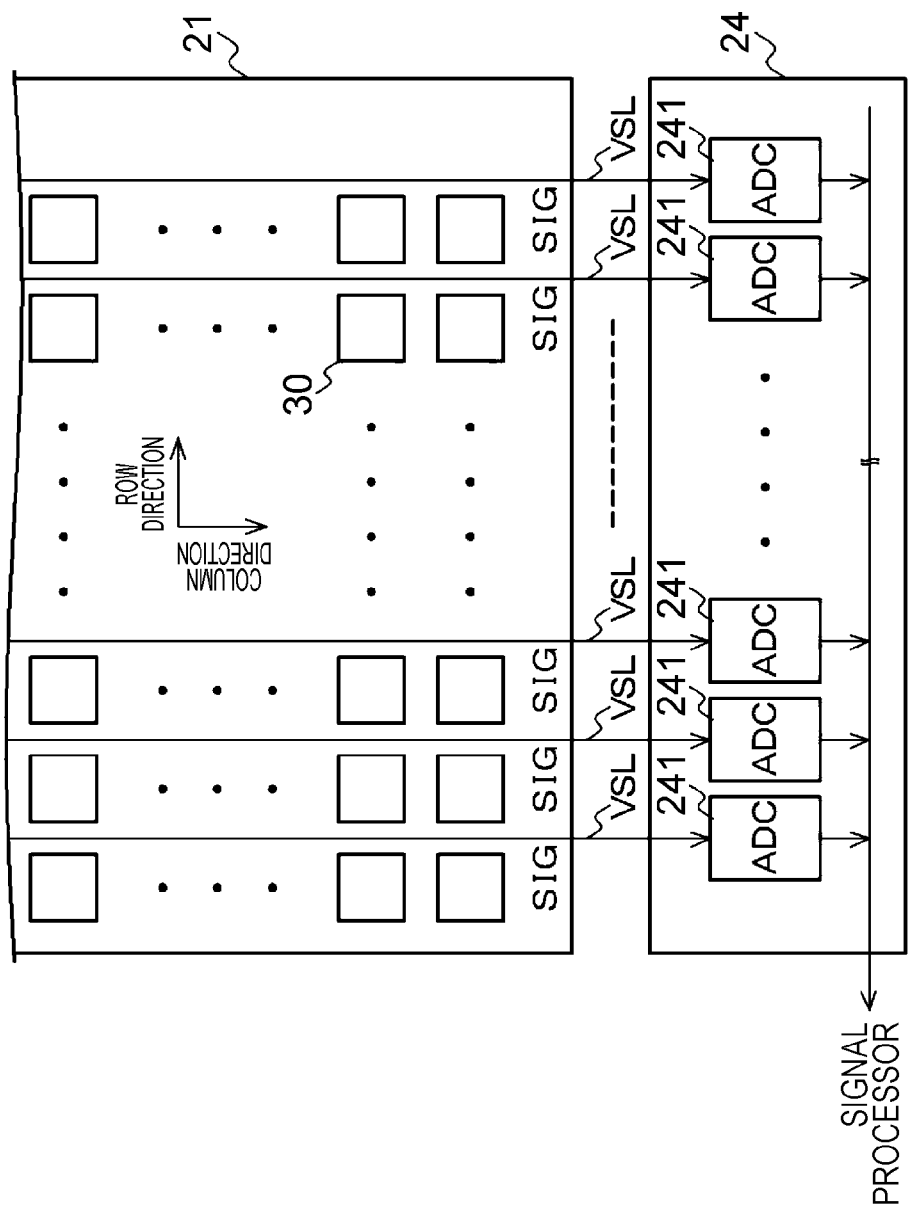
FIG. 11 is a block diagram depicting an example of a configuration of a column processor of the imaging apparatus according to the first configuration example.

FIG. 11 is a block diagram depicting an example of a configuration of the column processor 24 of the imaging apparatus 20 according to the first configuration example. As illustrated in FIG. 11, the column processor 24 of the present example includes a plurality of analog-to-digital converters (ADC) 241 arranged for each pixel column of the pixel array unit 21.

Note that, here, a configuration example has been exemplified in which the analog-to-digital converter 241 is arranged in a one-to-one correspondence relationship with respect to the pixel columns of the pixel array unit 21, but the present invention is not limited to this configuration example. For example, the analog-to-digital converter 241 can be arranged in units of a plurality of pixel columns, and the analog-to-digital converter 241 can be used in a time division manner between the plurality of pixel columns.

The analog-to-digital converter 241 converts the analog pixel signal SIG supplied via the vertical signal line VSL into a digital signal having a greater bit depth than the detection signal of the address event described above. For example, the detection signal of the address event has 2 bits, and then, the pixel signal is converted into a digital signal of 3 bits or more (16 bits or the like). The analog-to-digital converter 241 supplies the digital signal generated by analog-digital conversion to the signal processor 25.

[Configuration Example of Pixel]

Figure 12:
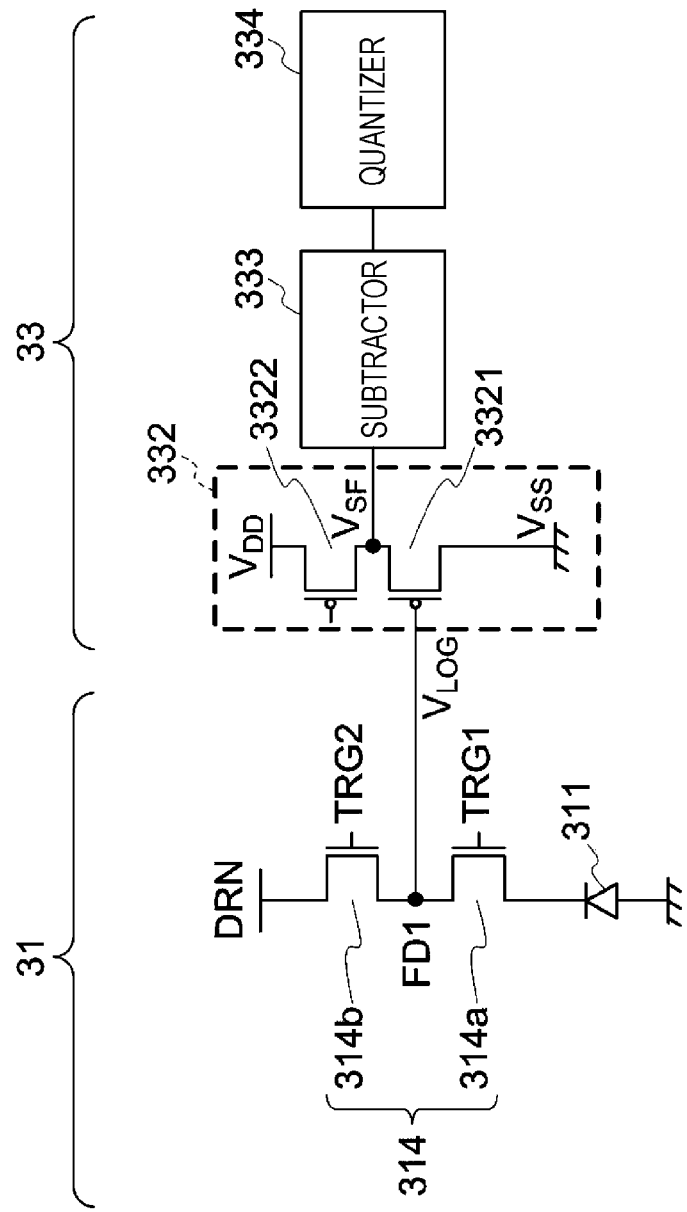
FIG. 12 is a circuit diagram depicting an example of an internal configuration of a light receiver and the address event detector.
Figure 13:
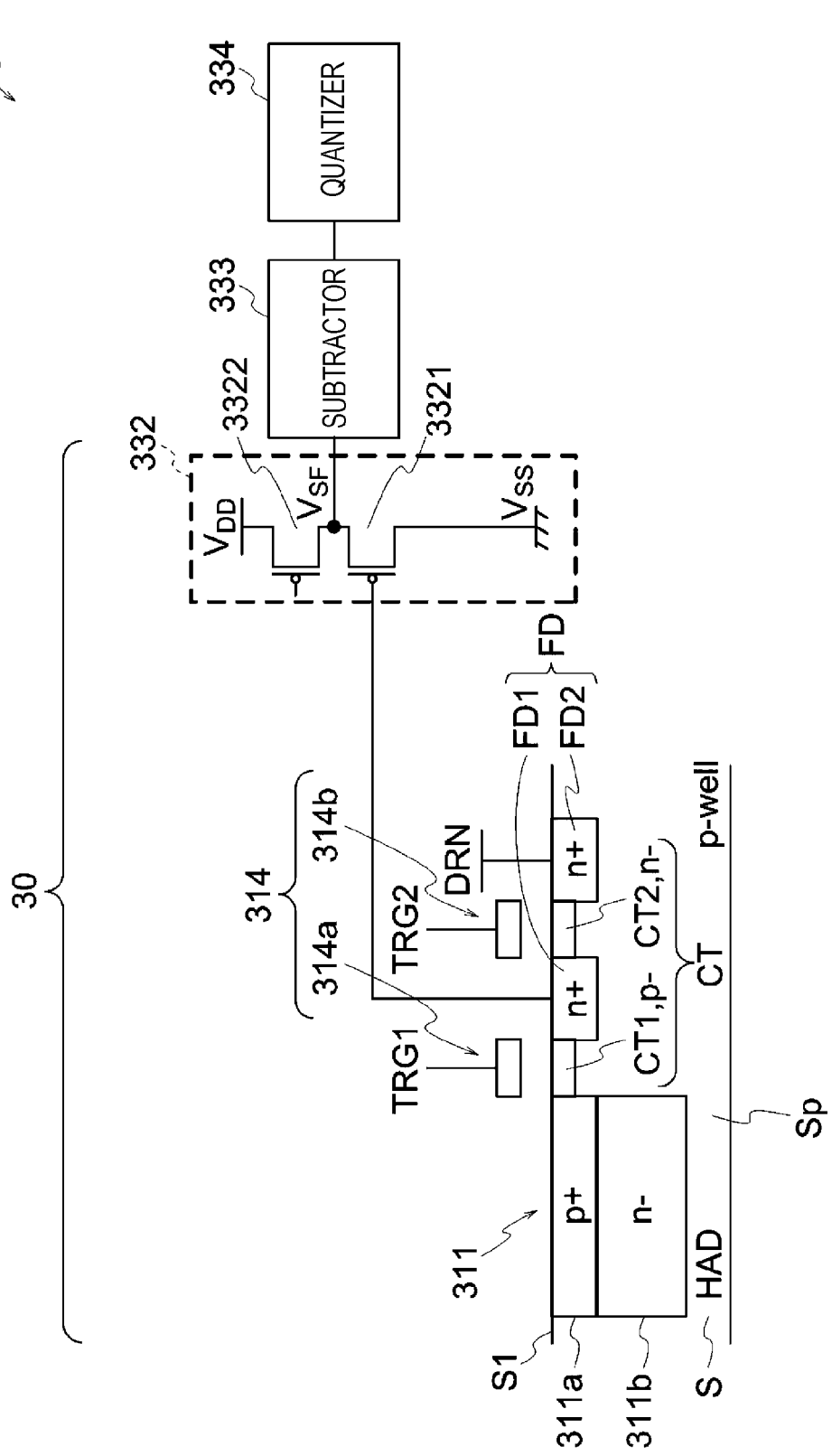
FIG. 13 is a sectional view depicting an example of a sectional structure around a light receiving element.

FIG. 12 is a circuit diagram depicting an example of an internal configuration of the light receiver 31 and the address event detector 33. The light receiver 31 includes the light receiving element 311, a transistor 314, and a floating diffusion (hereinafter, referred to as FD1). The address event detector 33 includes the buffer 332, the subtractor 333, and the quantizer 334. FIG. 13 is a sectional view depicting an example of a sectional structure a main part of the imaging apparatus 20, that is, around the light receiving element 311. Note that the transistor 314 includes, for example, two cascode-connected N-type transistors 314a and 314b, and the buffer 332 includes, for example, cascode-connected P-type transistors 3321 and 3322.

As illustrated in FIG. 13, the imaging apparatus 20 includes a light receiving element 311 disposed on a substrate S, a charge transfer region CT, a charge accumulation region FD, the transistor 314, and the address event detector 33.

The substrate S is, for example, a semiconductor substrate such as a silicon (Si) substrate. Furthermore, the substrate S is, for example, a P-type silicon substrate. The light receiving element 311, the charge transfer region CT, and the charge accumulation region FD are provided in the substrate S. S1 represents an upper surface of the substrate S illustrated in FIG. 13. Note that the substrate S may be stacked on another semiconductor substrate to transmit and receive signals between the two substrates via a via, Cu—Cu bonding, a bump, or the like.

The light receiving element 311 as a photoelectric converter generates a charge corresponding to a received light amount. The light receiving element 311 includes a p+ type semiconductor region 311a and an n– type semiconductor region 311b. The p+ type semiconductor region 311a and the n– type semiconductor region 311b are provided so as to form a pn junction, and function as a photoelectric converter that converts received light into a charge and generates a charge.

The charge transfer region CT is disposed at a position inside the substrate S not exposed to the substrate surface S1 and in contact with the light receiving element 311. Furthermore, the charge transfer region CT functions as a region that transfers the charge generated by the light receiving element 311 to a second charge accumulation region FD2. The charge transfer region CT includes a first charge transfer region CT1 and a second charge transfer region CT2. The first charge transfer region CT1 is, for example, a p– type semiconductor region. The second charge transfer region CT2 is, for example, an n– type semiconductor region. As illustrated in FIG. 13, the light receiving element 311 includes the p+ type semiconductor region 311a and the n– type semiconductor region 311b, and the n– type semiconductor region 311b is surrounded by a p-well region Sp and a p+ type semiconductor region 311a of the substrate S. Therefore, the n– type semiconductor region 311b is not exposed to the substrate surface S1. In addition, the first charge transfer region CT1 is provided so as to be in contact with the light receiving element 311, and the light receiving element 311 and the first charge transfer region CT1 is not provided with a contact.

Figure 14:
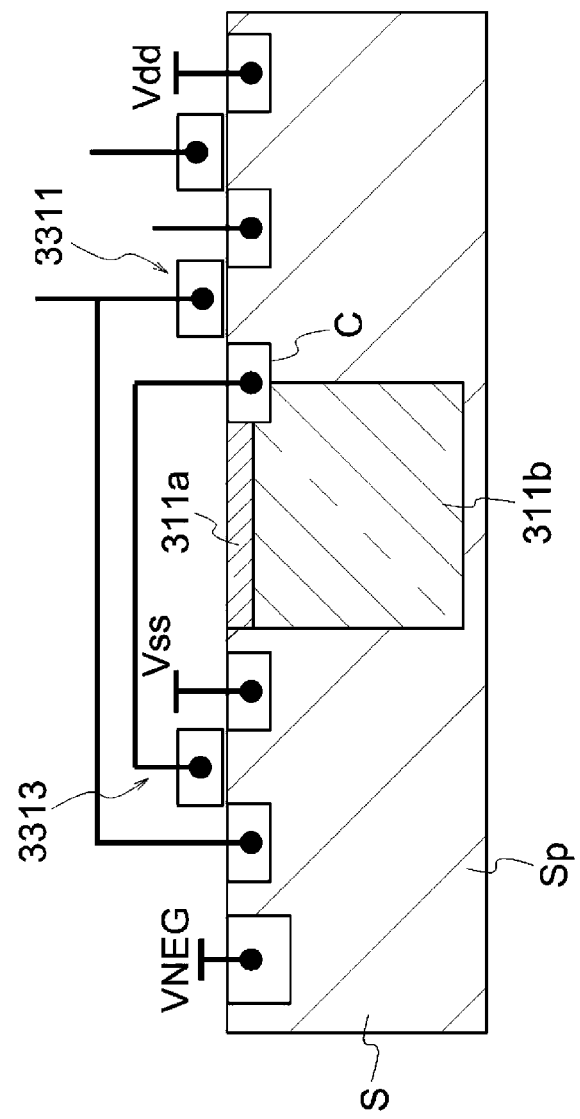
FIG. 14 is a sectional view depicting a comparative example of the sectional structure around the light receiving element.

FIG. 14 is a sectional view depicting a comparative example of the sectional structure around the light receiving element 311. FIG. 14 illustrates the sectional structure around the current-voltage converter 331 illustrated in FIG. 6. Note that a voltage Vss is, for example, a source voltage of the N-type transistor 3313 illustrated in FIG. 6.

In the example illustrated in FIG. 14, the contact C is provided at a position in contact with the n– type semiconductor region 311b of the light receiving element 311 for ease of the circuit. In this case, since electrons or holes flow toward the light receiving element 311 via the contact C, a depletion layer of the light receiving element 311 becomes narrow, and it becomes difficult to completely deplete the depletion layer. In this case, recombination between electrons and holes is likely to occur, and photocurrent is less likely to flow, and thus quantum efficiency is reduced. In addition, by providing the contact C, the n– type semiconductor region 311b is exposed to an interface, and becomes a generation source of a dark current. The interface that can be a generation source of a dark current includes, for example, an interface with an insulator such as an oxide and an interface with a metal. The dark current is generated, for example, by a connection defect of a semiconductor. The contact C is connected to the light receiving element 311 by ohmic contact between a semiconductor and metal, but the connection becomes incomplete at the interface due to crystal defects or the like. Free electrons are generated in the incompletely connected portion, and the electrons enter the light receiving element 311 to generate a dark current. In addition to the contact C, if the n– type semiconductor region 311b is in contact with a portion that is not a semiconductor, this causes generation of dark current. Therefore, when the n– type semiconductor region 311b is exposed to the surface S1, a dark current may be generated.

On the other hand, in the example illustrated in FIG. 13, the n– type semiconductor region 311b in the light receiving element 311 is not exposed to the substrate surface S1. The charge transfer region CT in contact with the light receiving element 311 is a floating diffusion region to which no contact is connected. The n– type semiconductor region 311b is surrounded by a (p-type) semiconductor region without being exposed to the substrate surface S1. As a result, crystal defects are suppressed, and the dark current can be suppressed. Furthermore, the n– type semiconductor region 311b is not provided with a contact. As a result, the light receiving element 311 can be completely depleted, and the quantum efficiency can be improved.

As illustrated in FIG. 13, the first charge transfer region CT1 and the second charge transfer region CT2 that transfer electrons from the light receiving element 311, and the first charge accumulation region FD1 and the second charge accumulation region FD2 that accumulate electrons are provided. In the present specification, the first charge transfer region CT1 and the second charge transfer region CT2 are collectively referred to as the charge transfer region CT, and the first charge accumulation region FD1 and the second charge accumulation region FD2 are collectively referred to as the charge accumulation region FD.

As illustrated in FIG. 13, the charge accumulation region FD is disposed apart from the charge transfer region CT in a direction of the substrate surface S1. The charge accumulation region FD accumulates the charge transferred from the charge transfer region CT. The charge accumulation region FD functions as a charge accumulation unit that accumulates a charge, and also functions as a part of the current-voltage converter 331 that converts the charge into an electrical signal and outputs the electrical signal.

The first charge accumulation region FD1 and the second charge accumulation region FD2 constituting the charge accumulation region FD are, for example, n+ type semiconductor regions.

In FIG. 13, a first transistor 314a that performs control to transfer electrons from the first charge transfer region CT1 to the first charge accumulation region FD1 and a second transistor 314b that performs control to transfer electrons from the second charge transfer region CT2 to the second charge accumulation region FD2 are provided. In the present specification, the first transistor 314a and the second transistor 314b are collectively referred to as the transistor 314.

The transistor 314 performs control to transfer a charge from the charge transfer region CT to the charge accumulation region FD. Specifically, the transistor 314 operates in a weak inversion region when transferring a charge from the charge transfer region CT to the charge accumulation region FD. The weak inversion region is a subthreshold region of the transistor.

A gate of the first transistor 314a constituting the transistor 314 is disposed above the first charge transfer region CT1, and a gate of the second transistor 314b is disposed above the second charge transfer region CT2. Specifically, a gate insulating film (not illustrated) is disposed between the gate of the first transistor 314a and the first charge transfer region CT1, and in a similar manner, a gate insulating film (not illustrated) is disposed between the gate of the second transistor 314b and the second charge transfer region CT2.

Furthermore, specifically, the first transistor 314a operates in the weak inversion region when transferring a charge from the charge transfer region CT to the first charge accumulation region FD1. The second transistor 314b operates in the weak inversion region when transferring a charge from the first charge accumulation region FD1 to the second charge accumulation region FD2. As a result, as illustrated in FIG. 12, the voltage of the first charge accumulation region FD1 can be converted into a logarithmic voltage (V Log). TRG1 and TRG2 indicate gate voltages for operating the first transistor 314a and the second transistor 314b in the weak inversion region, respectively. TRG1 is, for example, a voltage higher than a body (ground voltage) of the substrate S by about 1 V. Note that TRG1 and TRG2 are fixed voltages that can be changed depending on a type of the transistor and the like.

Figure 15:
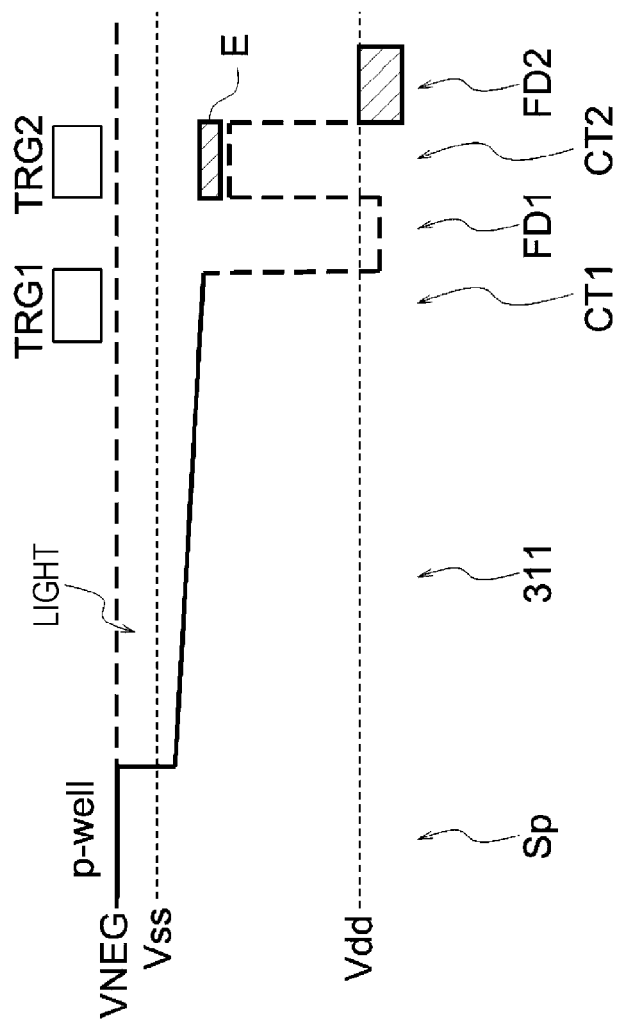
FIG. 15 is a schematic diagram depicting an example of a potential around the light receiving element.

FIG. 15 is a schematic diagram depicting an example of a potential around the light receiving element 311.

E represents an electron. Note that a potential VNEG is a potential of the p-well region Sp of the substrate S. By setting the p-well region Sp of the substrate S to a negative potential (VNEG), electrons generated in the light receiving element 311 can be suppressed from flowing to the p-well region Sp of the substrate S.

As illustrated in FIG. 15, the first transistor 314a and the second transistor 314b generate a potential gradient for transferring the charge from the charge transfer region CT to the charge accumulation region FD. The light is incident on the light receiving element 311, and then, the light is therefore generated in the light receiving element 311, and the overflowed electrons are transferred to the first charge accumulation region FD1 along the potential gradient. In addition, since the potential is fixed, the electrons can always pass through the first charge transfer region CT1.

Specifically, the potential changes in one direction from the charge transfer region CT to the charge accumulation region FD. More specifically, the potential changes in one direction from the first charge transfer region CT1 to the second charge accumulation region FD2 through the first charge accumulation region FD1 and the second charge transfer region CT2. By adjusting the gate voltage (TRG1 and TRG2), the potential is adjusted from the charge transfer region CT (first charge transfer region CT1) to the charge accumulation region FD (second charge accumulation region FD2). The voltage of the TRG1 is set to match the highest potential in the light receiving element 311, for example. As a result, since the potential gradually changes from the charge transfer region CT (first charge transfer region CT1) to the charge accumulation region FD (second charge accumulation region FD2), electrons can be easily transferred to the charge accumulation region FD (second charge accumulation region FD2) without being clogged. Note that the gate voltage (TRG1 and TRG2) may be adjusted in accordance with impurity concentration in the charge transfer region CT (the first charge transfer region CT1 and the second charge transfer region CT2).

In addition, the potential of the first charge accumulation region FD1 changes depending on a quantity of electrons flowing through the first charge transfer region CT1. The potential of the first charge accumulation region FD1 is used by the address event detector 33 to detect the presence or absence of an address event.

Furthermore, the potential in a channel of the second transistor 314b is higher than the potential in a channel of the first transistor 314a. As a result, electrons can easily flow from the first charge accumulation region FD1 to the second charge accumulation region FD2.

In addition, DRN in the second charge accumulation region FD2 illustrated in FIG. 13 is set to a voltage close to the VDD. Since it is necessary to accumulate electrons immediately below the DRN, the DRN is set to a voltage slightly lower than the VDD. DRN is, for example, about 2 V. Note that DRN, which is a voltage of the second charge accumulation region FD2, is also a fixed voltage, but may be temporarily changed to a low voltage such as about 0 V. Normally, at an initial stage of operation, it is necessary to stand by until the charge is accumulated in the first charge accumulation region FD1. In addition, it is difficult for the light receiving element 311 to generate electrons in the dark. Therefore, DRN is set to a low voltage, and then, the charge is injected into the pixel 30, and a standby time for charge accumulation can be reduced.

As illustrated in FIG. 13, the address event detector 33 as a detector outputs a detection signal indicating whether or not an absolute value of the change amount of the electrical signal according to an amount of the charge transferred by the transistor 314 exceeds a predetermined threshold value. Specifically, the address event detector 33 outputs a detection signal indicating whether or not the absolute value of the change amount of the electrical signal according to the amount of charge accumulated in the first charge accumulation region FD1 exceeds the threshold value.

The address event detector 33 includes a current-voltage converter including the charge transfer region CT and the charge accumulation region FD in FIG. 13, the buffer 332, the subtractor 333, and the quantizer 334. Note that processing operation of the address event detector 33 is substantially similar to processing operation of the address event detector 33 illustrated in FIG. 5, for example.

The current-voltage converter converts a current signal corresponding to the charge accumulated in the first charge accumulation region FD1 into a voltage signal. The subtractor 333 adjusts the level of the voltage signal. The quantizer 334 generates a detection signal by comparing an output signal of the subtractor 333 with a threshold voltage.

Next, operation of the imaging apparatus 20 will be described.

First, the charge generated in the light receiving element 311 is transferred to the charge transfer region CT disposed at a place inside the substrate S not exposed to the substrate surface S1 and in contact with the light receiving element 311 that generates a charge corresponding to the received light amount.

Next, the charge transferred from the light receiving element 311 to the charge transfer region CT is accumulated in the charge accumulation region FD disposed apart from the charge transfer region CT in the direction of the substrate surface S1.

Thereafter, the transistor 314 performs control to transfer the charge from the charge transfer region CT to the charge accumulation region FD.

Subsequently, the address event detector 33 outputs a detection signal indicating whether or not the absolute value of the change amount of the electrical signal according to the amount of the charge transferred by the transistor 314 exceeds a predetermined threshold value.

As described above, in the imaging apparatus 20 according to the present embodiment, the n− type semiconductor region 311b of the light receiving element 311 is not exposed to the substrate surface S1. Specifically, no contact is connected to the light receiving element 311. As a result, the dark current can be suppressed. Furthermore, by not connecting a contact to the light receiving element 311, the light receiving element 311 can be completely depleted. The complete depletion can suppress recombination between electrons and holes generated by light and improve the quantum efficiency. Therefore, light receiving sensitivity can be improved. By improving the light receiving sensitivity, a change in luminance of a weak light signal can be detected, and a highly sensitive event base vision sensor (EVS) can be achieved.

Note that the imaging apparatus 20 according to the present embodiment is applicable to both the asynchronous scheme illustrated in FIG. 2 and the synchronous (scan) scheme illustrated in FIG. 9.

FIGS. 12 and 13 illustrate the example in which the first charge transfer region CT1 and the second charge transfer region CT2 are provided as the charge transfer region CT, and the first charge accumulation region FD1 and the second charge accumulation region FD2 are provided as the charge accumulation region FD. However, only one charge transfer region CT may be provided, or three or more charge transfer regions CT may be provided. In a similar manner, only one charge accumulation region FD may be provided, or three or more charge accumulation regions FD may be provided. In addition, in FIGS. 12 and 13, the transistor 314 (the first transistor 314 a and the second transistor 314b) is provided to form a potential gradient from the charge transfer region CT to the charge accumulation region FD, but the transistor 314 is not necessarily required to form the potential gradient. For example, a potential gradient from the charge transfer region CT to the charge accumulation region FD can also be formed by adjusting a concentration of impurity ions in the p-well region Sp. Therefore, the transistor 314 (the first transistor 314a and the second transistor 314b) can be omitted.

Figure 16:
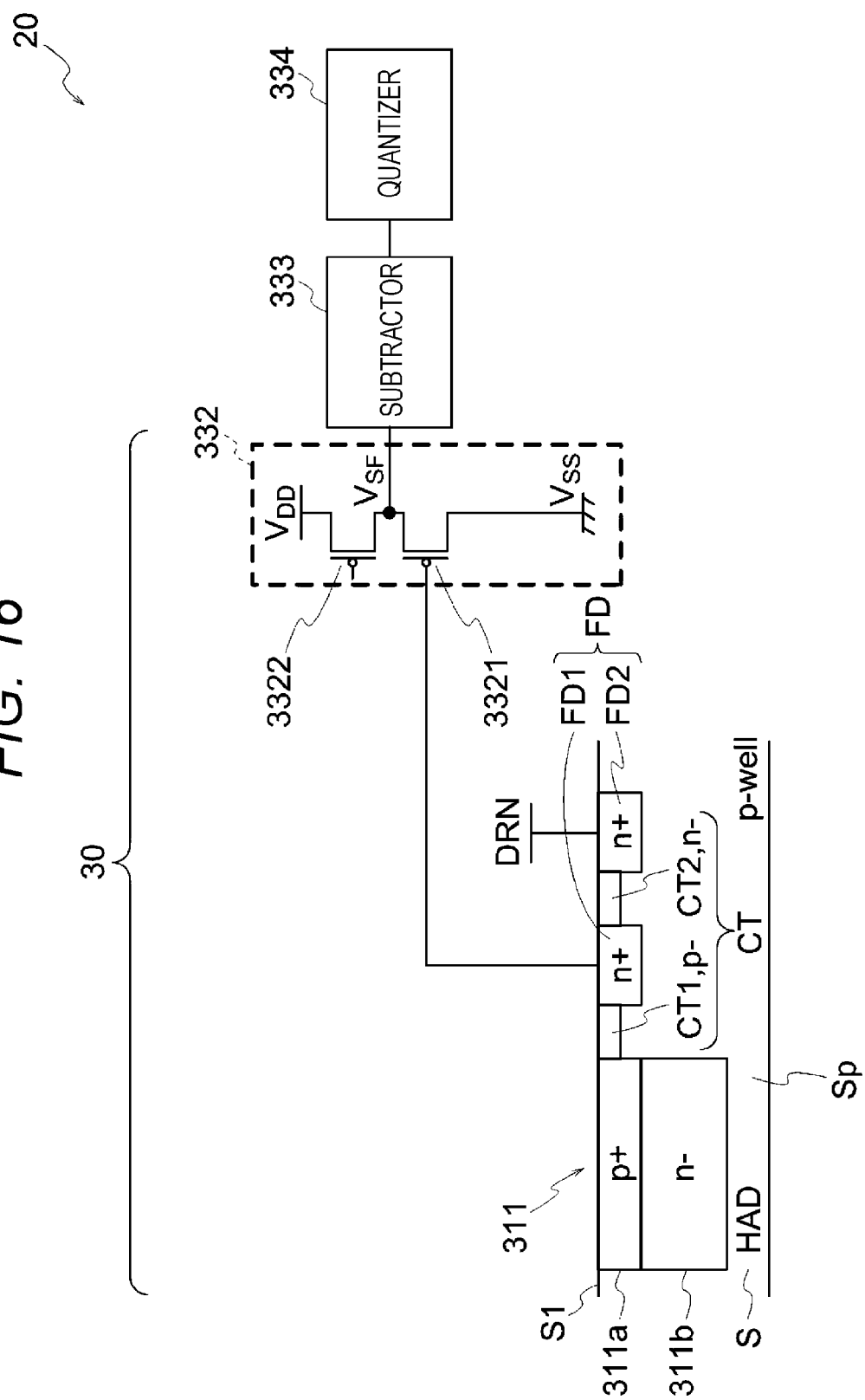
FIG. 16 is a sectional view depicting a first modification of the sectional structure around the light receiving element.

FIG. 16 is a sectional view depicting a first modification of the sectional structure around the light receiving element 311. In FIG. 16, the transistor 314 is not provided, and the potential is controlled by the impurity concentration due to ion implantation.

The imaging apparatus 20 further includes a potential gradient region.

Specifically, the potential gradient region is a region in which the concentration of impurity ions is adjusted. The potential gradient region is obtained by adjusting the impurity concentration in the charge transfer region CT. Therefore, in FIG. 16, the transistor 314 is not provided.

In the potential gradient region, the potential changes in one direction from the charge transfer region CT to the charge accumulation region FD. This potential gradient is similar to the state illustrated in FIG. 15. Therefore, the electrons generated by the light receiving element 311 are transferred to the charge accumulation region FD by the potential gradient.

The address event detector 33 outputs a detection signal indicating whether or not an absolute value of a change amount of an electrical signal according to an amount of the charge passing through the potential gradient region exceeds a predetermined threshold value.

As described above, the potential gradient may be obtained by adjusting the impurity concentration without providing the transistor 314. Thus, the circuit configuration can be further simplified.

Various modifications are conceivable for the configurations of the light receiver 31 and the address event detector 33 illustrated in FIG. 12. Hereinafter, some representative modifications will be described in order.

Figure 17A:
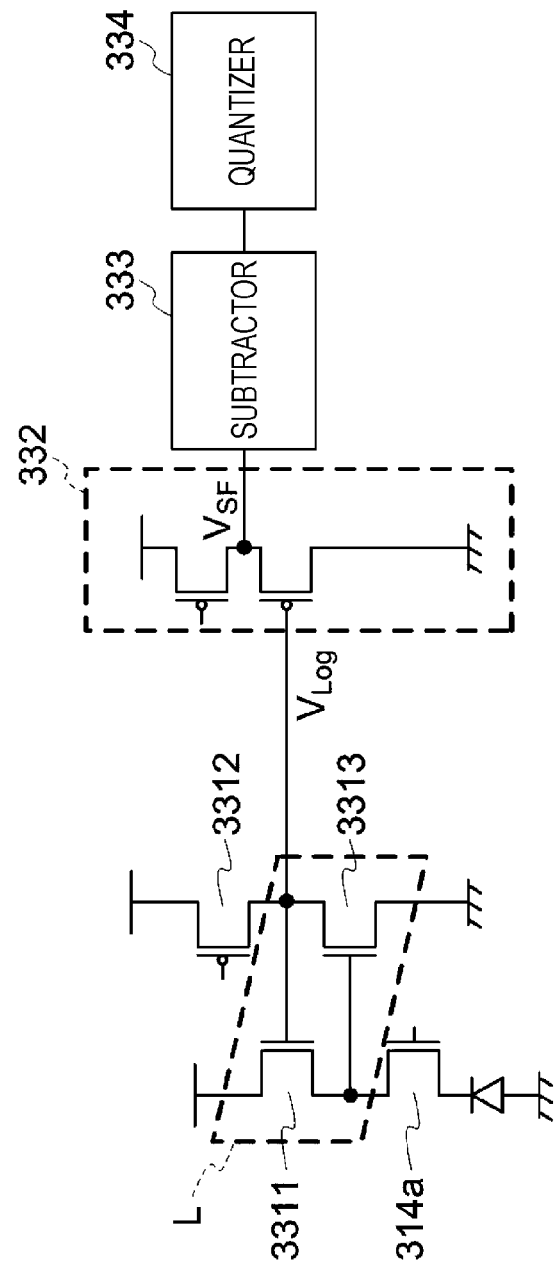
FIG. 17A is a circuit diagram depicting a first modification of the internal configurations of the light receiver and the address event detector.

FIG. 17A is a circuit diagram depicting a first modification of the internal configuration of the light receiver 31 and the address event detector 33. Note that, in FIG. 17A, the second transistor 314b illustrated in FIG. 12 is omitted.

FIG. 17A illustrates a circuit configuration called a gain type. The address event detector 33 includes a logarithmic conversion circuit L (logarithmic converter) that converts a current signal corresponding to the charge accumulated in the first charge accumulation region FD1 (charge accumulation region FD) into a logarithmic voltage signal. The logarithmic conversion circuit L constitutes a part of the current-voltage converter 331, and is a circuit in which a source of the N-type transistor 3311 illustrated in FIG. 6 is connected to a gate of the N-type transistor 3313, and a drain of the transistor 3313 is connected to a gate of the transistor 3311. The source of the transistor 3311 in the logarithmic conversion circuit L is connected to a drain of the first transistor 314a, a source of the transistor 3313 is connected to a ground node, and a voltage subjected to logarithmic conversion is output from the gate of the transistor 3311.

FIG. 17B is a circuit diagram depicting a second modification of the internal configuration of the light receiver 31 and the address event detector 33. The second modification is different from the first modification in that two logarithmic conversion circuits L are provided.

FIG. 17B illustrates a circuit configuration called a two-stage gain type. The address event detector 33 includes two logarithmic conversion circuits L connected in series. Since the two logarithmic conversion circuits L are connected in series, the circuit configuration is called a two-stage gain type. A potential change of the logarithmic voltage V Log obtained by the two-stage gain type is twice as large as a potential change of the logarithmic voltage V Log obtained by the gain type. Thus, reaction of a subsequent circuit is improved. Therefore, the address event detector 33 can read a small potential change as large. As a result, a weak change in the incident light can be accurately detected.

Figure 18:
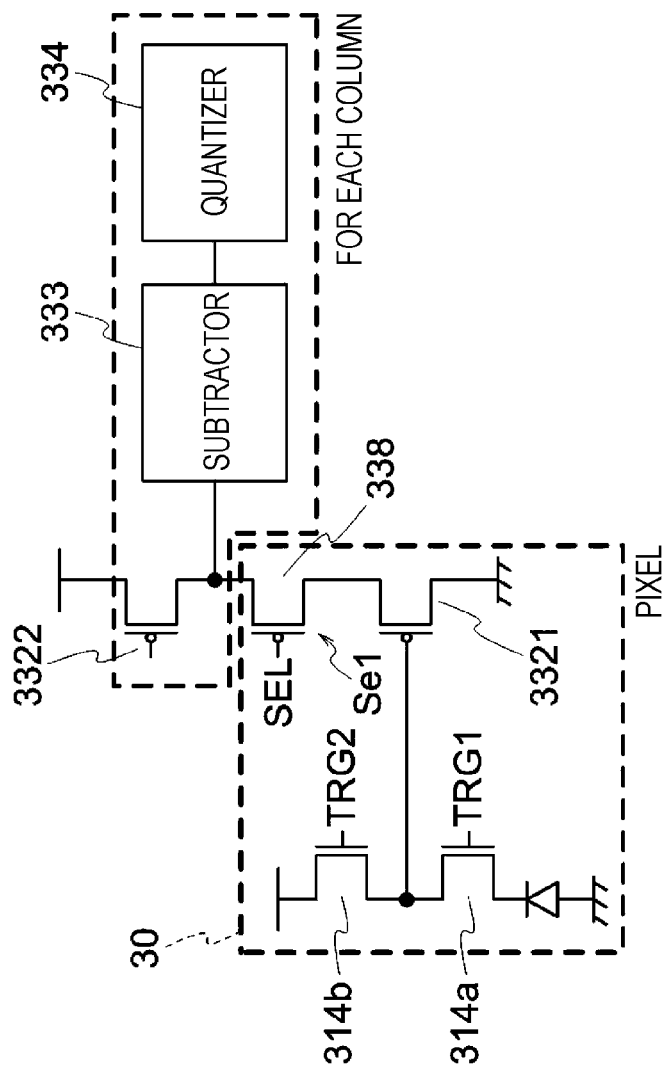
FIG. 18 is a circuit diagram depicting a third modification of the internal configuration of the light receiver and the address event detector.

FIG. 18 is a circuit diagram depicting a third modification of the internal configuration of the light receiver 31 and the address event detector 33.

The address event detector 33 further includes a selector Se1. The selector Se1 selects whether or not to supply the voltage signal converted by the current-voltage converter 331 to the subtractor 333. The selector Se1 includes, for example, a selection transistor 338 that is turned on or off by a signal logic of the selection signal SEL.

Furthermore, the subtractor 333 and the quantizer 334 are shared by the plurality of pixels 30. Specifically, the subtractor 333 and the quantizer 334 are provided for every column including the plurality of pixels. A signal (logarithmic voltage) photoelectrically converted by an arbitrary pixel in the same column can be switched by the selector Se1 and input to the subtractor 333. It is therefore sufficient to provide the subtractor 333 and the quantizer 334 for every column, and the configuration of the address event detector 33 can be simplified.

Figure 19:
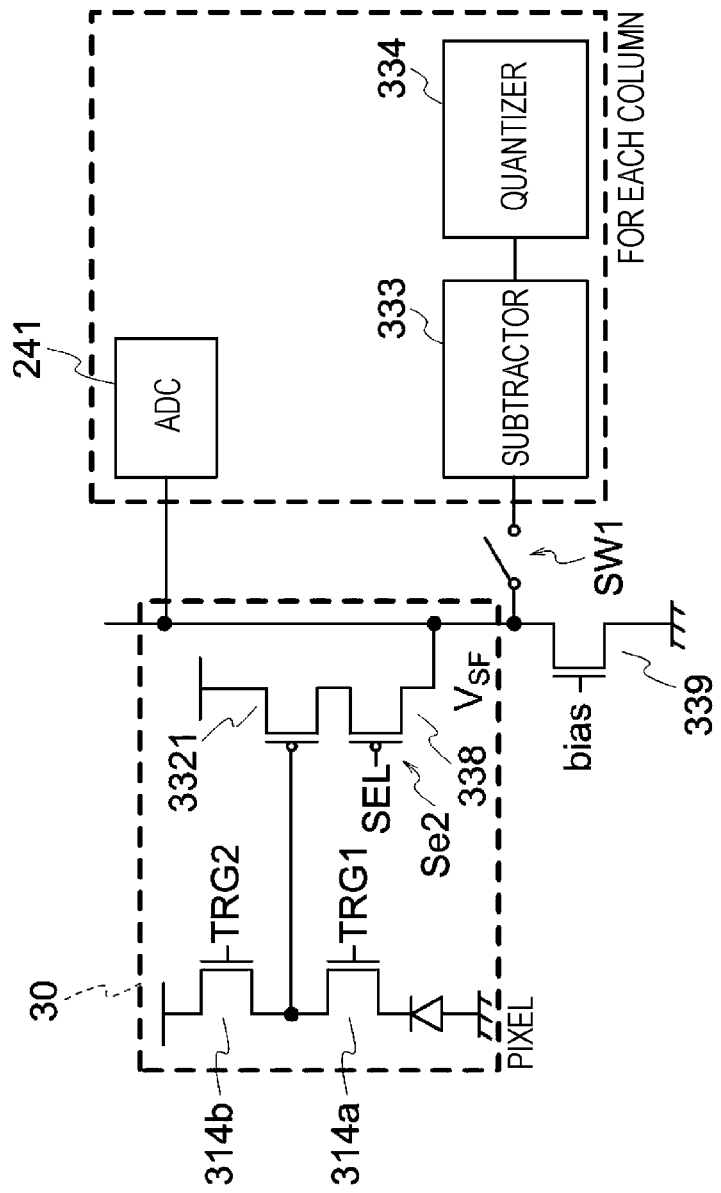
FIG. 19 is a circuit diagram depicting a fourth modification of the internal configuration of the light receiver and the address event detector.

FIG. 19 is a circuit diagram depicting a fourth modification of the internal configuration of the light receiver 31 and the address event detector 33.

The imaging apparatus 20 further includes the ADC 241 and a selector Se2.

The ADC 241 is disposed for every one of the plurality of pixels 30, and converts a luminance signal corresponding to the charge generated by the light receiving element 311 into a digital signal. The ADC 241 is similar to the ADC 241 illustrated in FIG. 11.

The selector Se2 selects whether or not to supply the charge accumulated in the first charge accumulation region FD1 to the ADC 241 or to supply the charge to the address event detector 33. The selector Se2 includes, for example, the selection transistor 338 and a switch SW1. The switch SW1 is provided between the selection transistor 338 and the subtractor 333. The subtractor 333 and the quantizer 334 are provided for every column.

In addition, the first transistor 314a and the second transistor 314b operate in a saturation region in a case where the selector Se2 supplies the charge accumulated in the first charge accumulation region FD1 to the ADC 241, and operate in a weak inversion region in a case where the selector Se2 supplies the charge accumulated in the first charge accumulation region FD1 to the address event detector 33. That is, the imaging apparatus 20 functions as either a normal image sensor or an EVS. This is because the imaging apparatus 20 has a circuit configuration substantially similar to a circuit configuration of a normal image sensor, and can execute operation of the normal image sensor and EVS by a switching operation mode of the transistors 314a and 314b. In a case where the imaging apparatus 20 functions as a normal image sensor, the first transistor 314a, the first charge accumulation region FD1, the P-type transistor 3321, and the selection transistor 338 function in a similar manner to the transfer transistor 312, the floating diffusion layer 324, the amplification transistor 322, and the selection transistor 323 illustrated in FIG. 4, respectively. Note that, in a case where the imaging apparatus 20 operates as a normal image sensor, the DRN illustrated in FIG. 13 may be, for example, a fixed voltage of the VDD.

As described above, by switching the selector Se2, it is possible to selectively operate the normal image sensor and the EVS by using the same sensor.

Note that, in the example illustrated in FIG. 19, a transistor 339 that supplies a constant current in response to a bias signal is provided. In addition, the transistor 339 functions as a current source.

Figure 20:
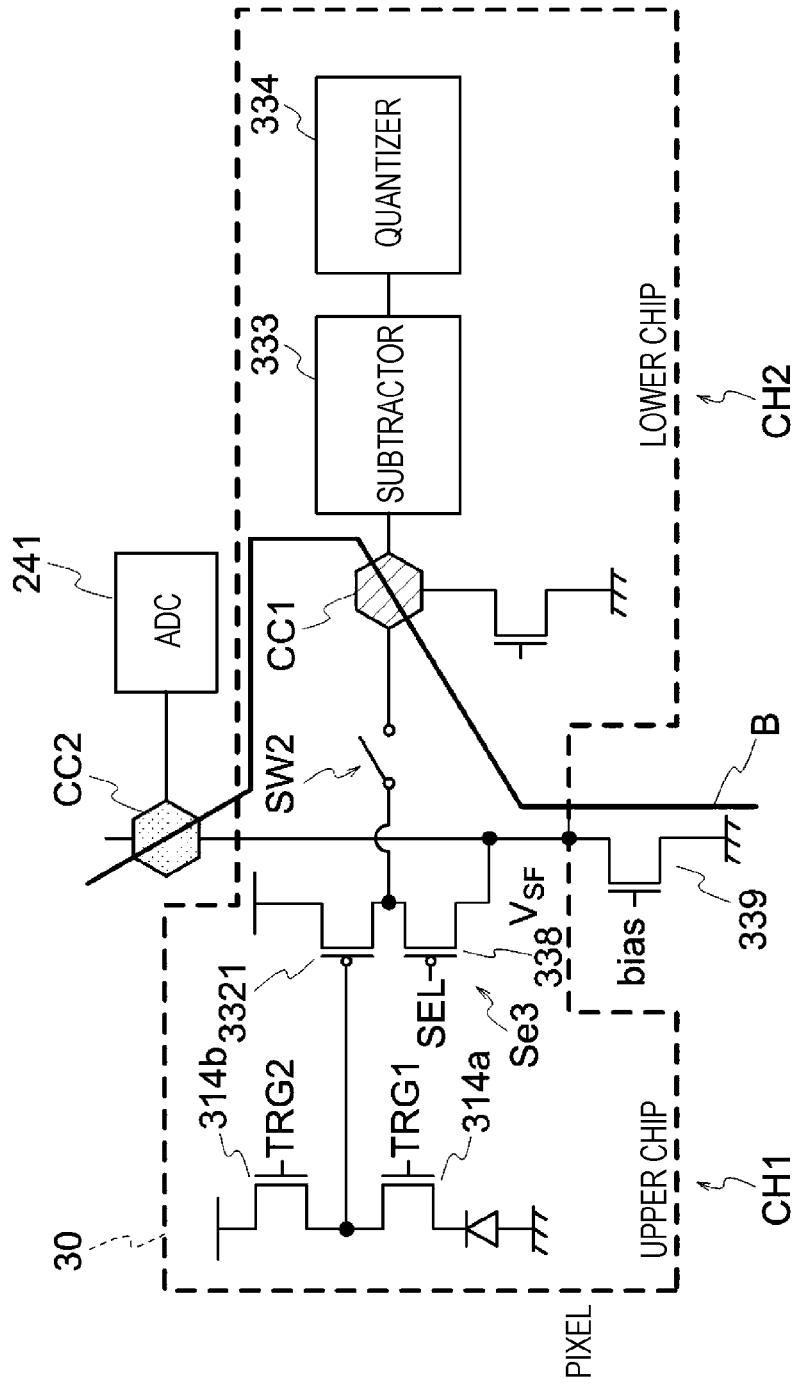
FIG. 20 is a circuit diagram depicting a fifth modification of the internal configuration of the light receiver and the address event detector.

FIG. 20 is a circuit diagram depicting a fifth modification of the internal configuration of the light receiver 31 and the address event detector 33. The fifth modification is different from the fourth modification in that the subtractor 333 and the quantizer 334 are provided for every pixel 30 due to a stacked structure.

A selector Se3 includes, for example, the selection transistor 338 and a switch SW2. The switch SW2 is provided between the selection transistor 338 and the subtractor 333. In addition, CC1 represents a connection portion provided between the selection transistor 338 and the ADC 241. CC2 represents a connection portion provided between the selection transistor 338 (switch SW2) and the subtractor 333. B represents a boundary line by the connection portions CC1 and CC2.

The imaging apparatus 20 further includes a first semiconductor chip CH1 and a second semiconductor chip CH2 that are stacked and transmit and receive signals to and from each other.

The first semiconductor chip CH1 includes the light receiving element 311 for every pixel 30. The first semiconductor chip CH1 is, for example, the light receiving chip 201 illustrated in FIG. 10. In addition, the first semiconductor chip CH1 is, for example, an upper chip illustrated in FIG. 20.

The second semiconductor chip CH2 includes the address event detector 33 for every pixel 30 and the ADC 241 for every column. The second semiconductor chip CH2 is, for example, the detection chip 202 illustrated in FIG. 10. In addition, the second semiconductor chip CH2 is, for example, a lower chip illustrated in FIG. 20.

The connection portion CC1 and the connection portion CC2 transmit and receive various signals between the first semiconductor chip CH1 and the second semiconductor chip CH2. The connection portion CC1 is provided for every pixel 30, for example, whereas the connection portion CC2 is provided for every column, for example. The connection portions CC1 and CC2 transmit and receive various signals between the first semiconductor chip and the second semiconductor chip via a via, Cu—Cu bonding, a bump, or the like.

As described above, by arranging the subtractor 333 and the quantizer 334 on the second semiconductor chip CH2, all the pixels 30 can be provided with the subtractor 333 and the quantizer 334 (EVS circuit). As a result, an event can be detected more quickly.

Figure 21:
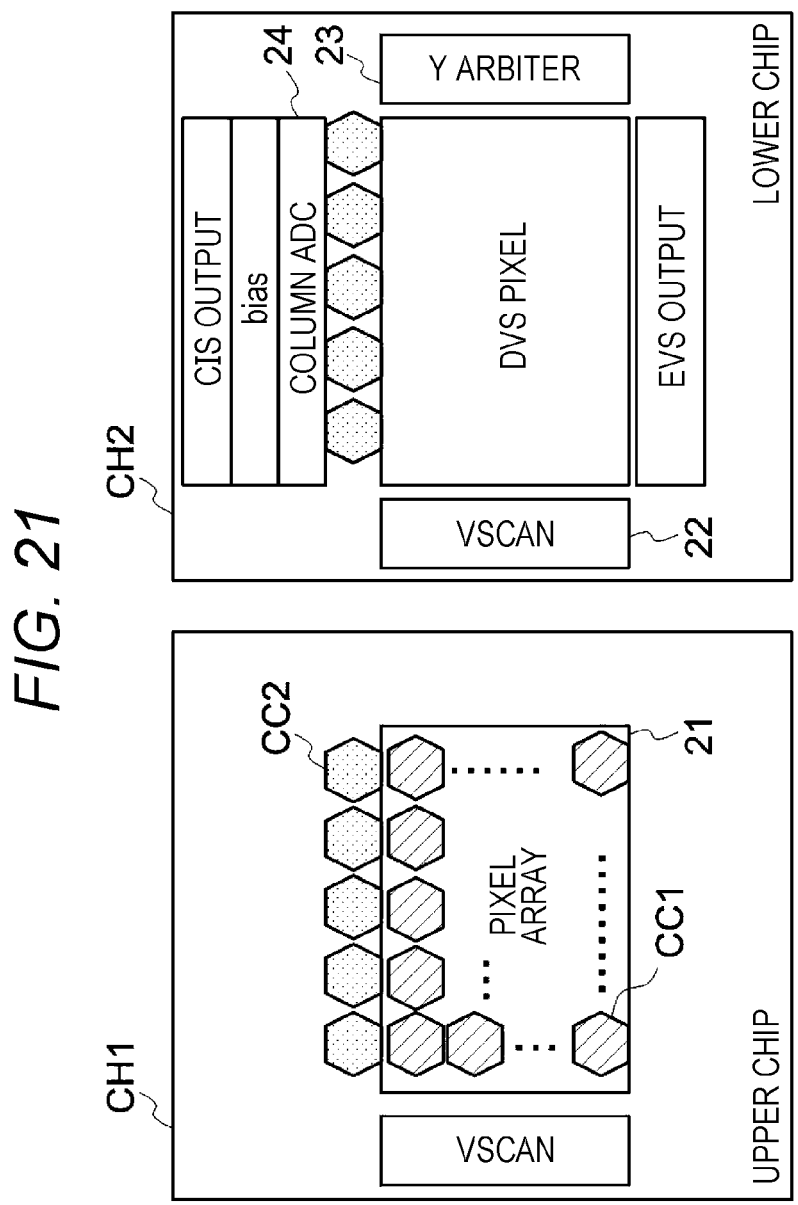
FIG. 21 is a diagram depicting a connection relationship between a first semiconductor chip and a second semiconductor chip in the circuit configuration of FIG. 20.

FIG. 21 is a diagram depicting a connection relationship between the first semiconductor chip CH1 and the second semiconductor chip CH2 in a circuit configuration in FIG. 20.

A plurality of the connection portions CC1 is provided for every pixel 30 in the pixel array unit 21. Note that the connection portions CC1 illustrated in FIG. 21 are schematically illustrated, and the number of the connection portions CC1 may be different from the actual number of the connection portions CC1.

A plurality of the connection portions CC2 is provided between the pixel array unit 21 and the column processor 24. Note that the connection portions CC2 illustrated in FIG. 21 are schematically illustrated, and the number of the connection portions CC2 may be different from the actual number of the connection portions CC2.

[Example of Application to Mobile Body]

The technology of the present disclosure (the present technology) can be applied to various products. For example, the technology of the present disclosure may be implemented as a device mounted on any type of mobile body such as an automobile, an electric vehicle, a hybrid electric vehicle, a motorcycle, a bicycle, a personal mobility, an airplane, a drone, a ship, a robot, and the like.

Figure 22:
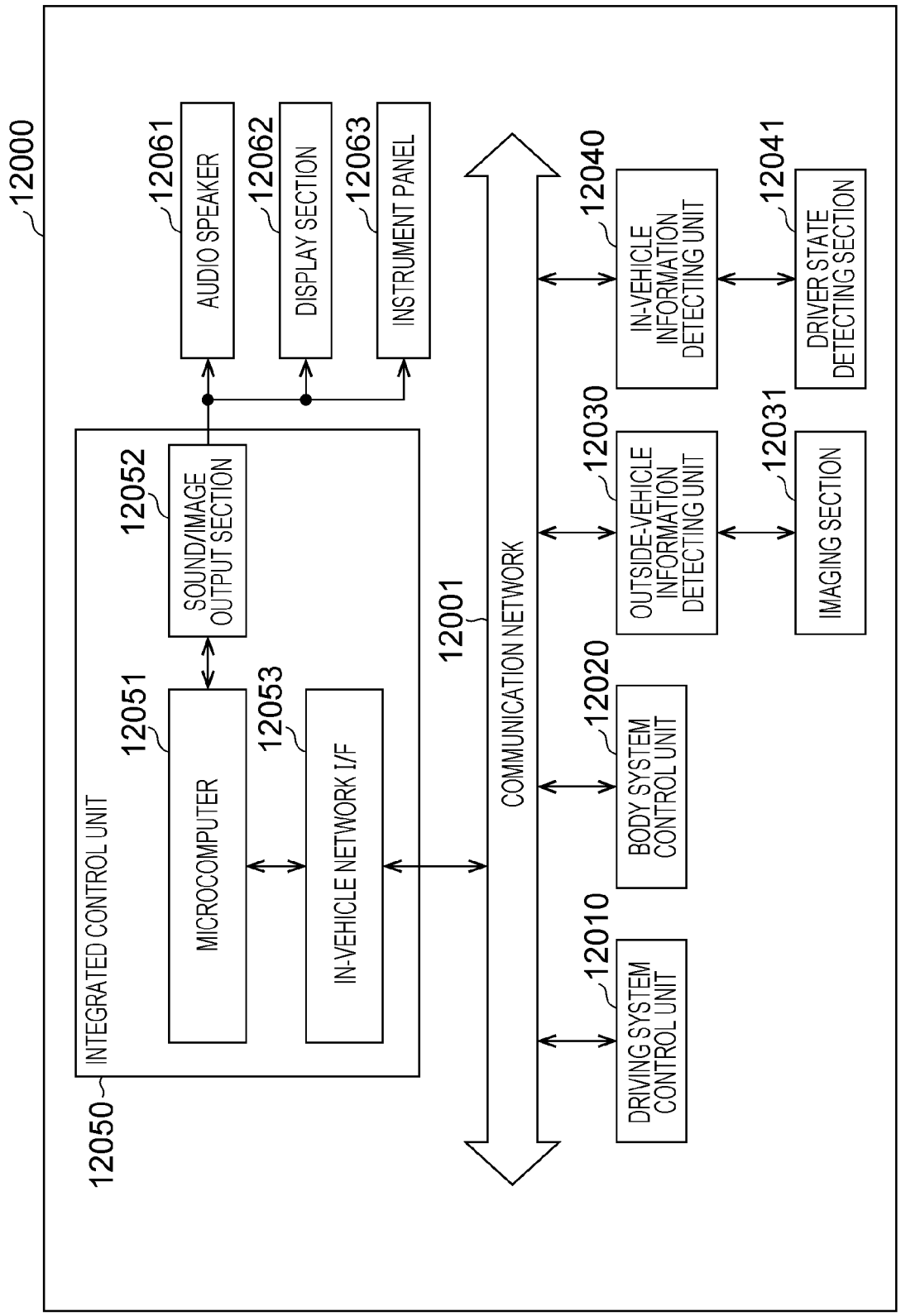
FIG. 22 is a block diagram depicting an example of a schematic configuration of a vehicle control system.

FIG. 22 is a block diagram depicting an example of a schematic configuration of a vehicle control system as an example of a mobile body control system to which the technology of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. Furthermore, as a functional configuration of the integrated control unit 12050, a microcomputer 12051, a sound/image output section 12052, and an in-vehicle network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are exemplified as output devices. The display section 12062 may, for example, include at least one of an on-board display and a head-up display.

Figure 23:
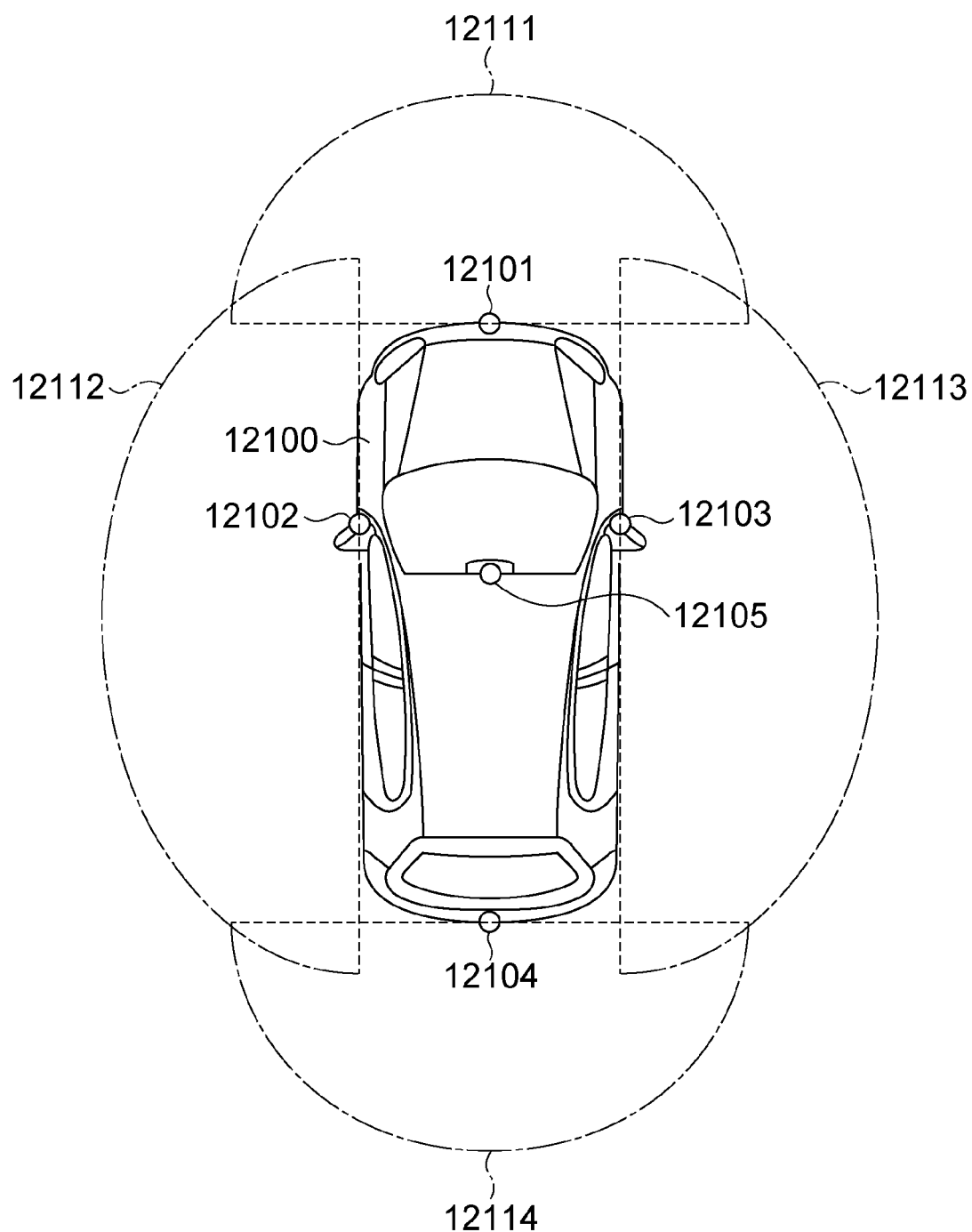
FIG. 23 is an explanatory diagram depicting an example of installation positions of an outside-vehicle information detector and an imaging section.

FIG. 23 is a diagram depicting an example of an installation position of the imaging section 12031.

In FIG. 23, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle or the like. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Note that, FIG. 23 depicts an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology of the present disclosure can be applied has been described above. The technology of the present disclosure can be applied to, for example, the imaging sections 12031, 12101, 12102, 12103, 12104, and 12105, the driver state detecting section 12041, and the like among the above-described configurations. Specifically, for example, the imaging system 10 in FIG. 1 including the imaging apparatus of the present disclosure can be applied to these imaging sections and detecting sections. Then, by applying the technology of the present disclosure, the light receiving sensitivity can be improved by suppressing dark current and improving quantum efficiency, and thus safer vehicle traveling can be achieved.

Note that the present technology can have the following configurations.

(1) An imaging apparatus including
    a photoelectric converter that generates a charge according to a received light amount,
    a charge transfer region that is disposed at a place inside a substrate not exposed to a substrate surface and in contact with the photoelectric converter, and to which the charge generated by the photoelectric converter is transferred,
    a charge accumulation region that is disposed apart from the charge transfer region in a substrate surface direction and accumulates the charge transferred from the charge transfer region,
    a transistor that performs control to transfer the charge from the charge transfer region to the charge accumulation region, and
    a detector that outputs a detection signal indicating whether or not an absolute value of a change amount of an electrical signal according to an amount of the charge transferred by the transistor exceeds a predetermined threshold value.

(2) The imaging apparatus according to (1), in which the charge transfer region includes a floating diffusion region to which no contact is connected.

(3) The imaging apparatus according to (1) or (2), in which the transistor operates in a weak inversion region when transferring the charge from the charge transfer region to the charge accumulation region.

(4) The imaging apparatus according to any one of (1) to (3), in which
the transistor includes a first transistor and a second transistor disposed between the charge transfer region and the charge accumulation region,
the charge accumulation region includes a first charge accumulation region and a second charge accumulation region,
the first transistor performs control to transfer the charge from the charge transfer region to the first charge accumulation region, and
the second transistor performs control to transfer the charge from the first charge accumulation region to the second charge accumulation region.

(5) The imaging apparatus according to (4), in which
the first transistor operates in a weak inversion region when transferring the charge from the charge transfer region to the first charge accumulation region, and
the second transistor operates in the weak inversion region when transferring the charge from the first charge accumulation region to the second charge accumulation region.

(6) The imaging apparatus according to (4) or (5), in which the detector outputs the detection signal indicating whether or not the absolute value of the change amount of the electrical signal according to the amount of charge accumulated in the first charge accumulation region exceeds the threshold value.

(7) The imaging apparatus according to any one of (4) to (6), in which the first transistor and the second transistor generate a potential gradient for transferring the charge from the charge transfer region to the charge accumulation region.

(8) The imaging apparatus according to any one of (4) to (7), in which a potential in a channel of the second transistor is higher than a potential in a channel of the first transistor.

(9) The imaging apparatus according to any one of (4) to (8), in which
the detector includes
a current-voltage converter that converts a current signal corresponding to the charge accumulated in the first charge accumulation region into a voltage signal,
a subtractor that adjusts a level of the voltage signal,
a quantizer that generates the detection signal by comparing an output signal of the subtractor with a threshold voltage, and
a selector that selects whether or not to supply the voltage signal converted by the current-voltage converter to the subtractor, and
the subtractor and the quantizer are shared by a plurality of pixels each having the photoelectric converter.

(10) The imaging apparatus according to any one of (4) to (8), further including
an ADC that is disposed for every one of a plurality of pixels and converts a luminance signal according to the charge generated by the photoelectric converter into a digital signal, and
a selector that selects whether or not to supply the charge accumulated in the first charge accumulation region to the ADC or to supply the charge accumulated in the first charge accumulation region to the detector,
in which the first transistor and the second transistor operate in a saturation region in a case where the selector supplies the charge accumulated in the first charge accumulation region to the ADC, and operate in a weak inversion region in a case where the selector supplies the charge accumulated in the first charge accumulation region to the detector.

(11) The imaging apparatus according to (10), further including a first semiconductor chip and a second semiconductor chip that are stacked and transmit and receive signals to and from each other,
in which the first semiconductor chip includes the photoelectric converter for every one of the pixels, and
the second semiconductor chip includes the detector and the ADC for every one of the pixels.

(12) An imaging apparatus including
a photoelectric converter that generates a charge according to a received light amount,
a charge transfer region that is disposed at a place inside a substrate not exposed to a substrate surface and in contact with the photoelectric converter, and to which the charge generated in the photoelectric converter is transferred,
a charge accumulation region that is disposed apart from the charge transfer region in a substrate surface direction and accumulates the charge transferred from the charge transfer region,
a potential gradient region in which a potential changes in one direction from the charge transfer region to the charge accumulation region, and
a detector that outputs a detection signal indicating whether or not an absolute value of a change amount of an electrical signal according to an amount of the charge passing through the potential gradient region exceeds a predetermined threshold value.

(13) The imaging apparatus according to (12), in which the potential gradient region includes a region in which a concentration of impurity ions is adjusted.

(14) An imaging method including
transferring a charge generated in a photoelectric converter that generates a charge according to a received light amount to a charge transfer region that is disposed at a place inside a substrate not exposed to a substrate surface and in contact with the photoelectric converter,
accumulating the charge transferred from the photoelectric converter to the charge transfer region in a charge accumulation region that is disposed apart from the charge transfer region in a substrate surface direction,
performing control, by a transistor, to transfer the charge from the charge transfer region to the charge accumulation region, and
outputting a detection signal indicating whether or not an absolute value of a change amount of an electrical signal according to an amount of the charge transferred by the transistor exceeds a predetermined threshold value.

Aspects of the present disclosure are not limited to the individual embodiments described above, but include various modifications that can be conceived by those skilled in the art, and the effects of the present disclosure are not limited to the contents described above. That is, various additions, modifications, and partial deletions can be made without departing from the conceptual idea and spirit of the present disclosure derived from the contents defined in the claims and equivalents thereof.

REFERENCE SIGNS LIST

10 Imaging system
11 Imaging lens
12 Recorder
13 Controller

20 Imaging apparatus
21 Pixel array unit
22 Drive unit
23 Arbiter unit
24 Column processor
25 Signal processor
27 Read region selection unit
28 Signal generator
30 Pixel
31 Light receiver
32 Pixel signal generator
33 Address event detector
40 Controller
41(411, 412) Arithmetic circuit
42 Delay circuit
43 AND circuit
44 Multiplexer
51 First detector
52 Flicker determiner
53 Second detector
54 Flicker frequency determiner
55 Event counter
56 Shift register
57 Output rate converter
58 Pixel control circuit
59 Counter map
59a Counter
60 Memory
61 Event selection unit
241 ADC
311 Light receiving element
314 Transistor
314a First transistor
314b Second transistor
333 Subtractor
334 Quantizer
CH1 First semiconductor chip
CH2 Second semiconductor chip
CT Charge transfer region
CT1 First charge transfer region
CT2 Second charge transfer region
FD Charge accumulation region
FD1 First charge accumulation region
FD2 Second charge accumulation region
S Substrate
S1 Substrate surface
Se1 to Se3 Selector

The invention claimed is:

1. An imaging apparatus, comprising:
a photoelectric converter configured to:
   receive an amount of light; and
   generate a charge corresponding to the amount of the light;
a substrate that has a substrate surface;
a first charge transfer region inside the substrate, wherein
   the first charge transfer region is not exposed to the substrate surface,
   the first charge transfer region is in contact with the photoelectric converter, and
   the first charge transfer region is configured to:
      receive the generated charge; and
      transfer the generated charge;
a first charge accumulation region apart from the first charge transfer region in a direction along the substrate surface, wherein
   the first charge accumulation region is configured to accumulate the generated charge transferred from the first charge transfer region;
a first transistor configured to transfer the generated charge from the first charge transfer region to the first charge accumulation region; and
a detector configured to output a detection signal that indicates whether an absolute value of an amount of change in an electrical signal exceeds a threshold value, wherein
   the amount of the change in the electrical signal is based on an amount of the generated charge transferred by the first transistor.

2. The imaging apparatus according to claim 1, wherein the first charge transfer region includes a floating diffusion region to which a specific contact is not connected.

3. The imaging apparatus according to claim 1, wherein the first transistor is further configured to operate in a weak inversion region in the transfer of the generated charge from the first charge transfer region to the first charge accumulation region.

4. The imaging apparatus according to claim 1, further comprising:
a second transistor;
a second charge transfer region; and
a second charge accumulation region, wherein
   the first transistor is between the first charge transfer region and the first charge accumulation region,
   the second transistor is between the second charge transfer region and the second charge accumulation region, and
   the second transistor is configured to transfer the accumulated charge from the first charge accumulation region to the second charge accumulation region.

5. The imaging apparatus according to claim 4, wherein
   the first transistor is further configured to operate in a weak inversion region in the transfer of the generated charge from the first charge transfer region to the first charge accumulation region, and
   the second transistor is further configured to operate in the weak inversion region in the transfer of the accumulated charge from the first charge accumulation region to the second charge accumulation region.

6. The imaging apparatus according to claim 4, wherein
   the first transistor is further configured to generate a potential gradient for the transfer of the generated charge from the first charge transfer region to the first charge accumulation region, and
   the second transistor is further configured to generate the potential gradient for the transfer of the accumulated charge from the first charge accumulation region to the second charge accumulation region.

7. The imaging apparatus according to claim 4, wherein a potential in a channel of the second transistor is higher than a potential in a channel of the first transistor.

8. The imaging apparatus according to claim 4, further comprising a plurality of pixels, wherein
   each pixel of the plurality of pixels includes the photoelectric converter,
   the detector includes:
      a current-voltage converter configured to convert a current signal corresponding to the charge accumulated in the first charge accumulation region into a voltage signal;

a subtractor;
a quantizer; and
a selector configured to determine to supply the voltage signal to the subtractor,
the subtractor is configured to adjust a level of the supplied voltage signal to output an output signal,
the quantizer is configured to:
compare the output signal with a threshold voltage; and
generate the detection signal based on the comparison, and
the subtractor and the quantizer are shared by the plurality of pixels.

9. The imaging apparatus according to claim 4, further comprising:
a plurality of pixels;
an analog-to-digital converter (ADC) for each pixel of the plurality of pixels, wherein
the ADC is configured to convert a luminance signal corresponding to the generated charge into a digital signal; and
a selector configured to determine to supply the charge accumulated in the first charge accumulation region to one of the ADC or the detector, wherein
each of the first transistor and the second transistor is further configured to:
operate in a saturation region in a case where the selector supplies the charge accumulated in the first charge accumulation region to the ADC; and
operate in a weak inversion region in a case where the selector supplies the charge accumulated in the first charge accumulation region to the detector.

10. The imaging apparatus according to claim 9, further comprising:
a first semiconductor chip; and
a second semiconductor chip on the first semiconductor chip, wherein
the first semiconductor chip is configured to transmit signals to the second semiconductor chip,
the second semiconductor chip is configured to receive the signals from the first semiconductor chip,
the signals includes the luminance signal,
the first semiconductor chip includes the photoelectric converter for each pixel of the plurality of pixels, and
the second semiconductor chip includes the detector and the ADC for each pixel of the plurality of pixels.

11. An imaging apparatus, comprising:
a photoelectric converter configured to:
receive an amount of light; and
generate a charge corresponding to the amount of the light;
a substrate that has a substrate surface;
a charge transfer region inside the substrate, wherein
the charge transfer region is not exposed to the substrate surface,
the charge transfer region is in contact with the photoelectric converter, and
the charge transfer region is configured to:
receive the generated charge; and
transfer the generated charge;
a charge accumulation region apart from the charge transfer region in a direction along the substrate surface, wherein
the charge accumulation region is configured to accumulate the generated charge transferred from the charge transfer region;
a potential gradient region in which a potential changes in one direction from the charge transfer region to the charge accumulation region; and
a detector configured to output a detection signal that indicates whether an absolute value of an amount of change in an electrical signal exceeds a threshold value, wherein
the amount of the change in the electrical signal is based on an amount of the charge that passes through the potential gradient region.

12. The imaging apparatus according to claim 11, wherein the potential gradient region includes a region in which a concentration of impurity ions is adjustable.

13. An imaging method, comprising:
in an imaging apparatus that includes a photoelectric converter, a substrate, a charge transfer region, a charge accumulation region, a transistor, and a detector:
receiving, by the photoelectric converter, an amount of light;
generating, by the photoelectric converter, a charge corresponding to the amount of the light;
receiving, by the charge transfer region, the generated charge, wherein
the charge transfer region is inside the substrate,
the charge transfer region is not exposed to a substrate surface of the substrate, and
the charge transfer region is in contact with the photoelectric converter;
transferring, by the charge transfer region, the generated charge,
accumulating, by the charge accumulation region, the generated charge transferred from the charge transfer region, wherein
the charge accumulation region is apart from the charge transfer region in a direction along the substrate surface;
transferring, by the transistor, the generated charge from the charge transfer region to the charge accumulation region; and
outputting, by the detector, a detection signal that indicates whether an absolute value of an amount of change in an electrical signal exceeds a threshold value, wherein
the amount of the change in the electrical signal is based on an amount of the generated charge transferred by the transistor.

* * * * *